(12) United States Patent
Yamaguchi et al.

(10) Patent No.: US 7,534,657 B2
(45) Date of Patent: May 19, 2009

(54) METHOD OF MANUFACTURING A SEMICONDUCTOR DEVICE

(75) Inventors: Yoshihiko Yamaguchi, Iide (JP); Atsushi Fujishima, Hino (JP); Yusuke Ohta, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 259 days.

(21) Appl. No.: 10/953,955

(22) Filed: Sep. 30, 2004

(65) Prior Publication Data

US 2005/0085009 A1  Apr. 21, 2005

(30) Foreign Application Priority Data

Sep. 30, 2003  (JP) ............... 2003-340741

(51) Int. Cl.
 *H01L 21/44* (2006.01)
(52) U.S. Cl. ............... 438/115; 438/113; 438/114; 438/460; 257/E21.524; 257/E21.525
(58) Field of Classification Search ............... 438/115; 257/E21.524, E21.525
See application file for complete search history.

(56) References Cited

U.S. PATENT DOCUMENTS 5,981,361 A * 11/1999 Yamada ............... 438/464
6,111,317 A * 8/2000 Okada et al. ............... 257/737
6,624,504 B1 * 9/2003 Inoue et al. ............... 257/668
7,169,691 B2 * 1/2007 Doan ............... 438/598
2003/0015218 A1 * 1/2003 Bran ............... 134/1.3

FOREIGN PATENT DOCUMENTS

JP  2002-305285  10/2002

* cited by examiner

*Primary Examiner*—Jerome Jackson, Jr.
*Assistant Examiner*—Jose R Diaz
(74) *Attorney, Agent, or Firm*—Antonelli, Terry, Stout & Kraus, LLP.

(57) ABSTRACT

A method of manufacturing a semiconductor device involves the steps of: forming a plurality of product formation areas each having a circuit and a plurality of first electrode pads over a main surface of a semiconductor wafer; arranging a plurality of second electrode pads with larger pitches than the first electrode pads in each of the product formation areas; segmenting the semiconductor wafer to separate the plural product formation areas and provide a plurality of semiconductor devices each having the circuit, the plural first electrode pads and the plural second electrode pads on a first surface; and cleaning foreign matter off the first surface of the semiconductor device after the step of segmenting the semiconductor devices.

5 Claims, 27 Drawing Sheets

AIR BLOW CLEANING

BLAST CLEANING

WET CLEANING

METHOD OF MANUFACTURING A SEMICONDUCTOR DEVICE

CROSS-REFERENCE TO RELATED APPLICATION

The present application claims priority from Japanese patent application No. 2003-340741, filed on Sep. 30, 2003, the content of which is hereby incorporated by reference into this application.

BACKGROUND OF THE INVENTION

The present invention relates to semiconductor device manufacturing technology.

In connection with semiconductor devices of the type incorporated in small size electronic equipment, such as mobile phones, personal digital assistants and mobile personal computers, there is a demand for thin models, compact models and multi-pin models. As an example of semiconductor devices which meet such a demand, CSP (Chip Size Package) type devices are known. Various types of CSP type semiconductor devices have been proposed and commercialized. One of them is a CSP type semiconductor device which is manufactured using wafer packaging technology which combines wafer processing and a package assembly process (hereinafter called a wafer level CSP type semiconductor device). It is easier to make the wafer level CSP type semiconductor device into a compact, low cost model than what is called the chip level CSP type semiconductor device (CSP type semiconductor device which is manufactured by packaging, one by one, semiconductor chips produced by segmenting a semiconductor wafer), because the package flat surface size of the wafer level CSP type semiconductor device is almost equal to the semiconductor chip flat surface size.

The wafer level CSP type semiconductor device mainly includes: a chip layer which corresponds to a semiconductor chip; a rewiring (secondary wiring) layer formed over the main surface of the chip layer; and solder bumps (protruding electrodes) disposed as external connection terminals over the secondary wiring layer. The chip layer includes: a semiconductor substrate; a multilayer wiring layer (primary wiring layer) formed as a laminate of plural insulating layers and plural wiring layers; and a surface protective film which covers the multilayer wiring layer. In the chip layer, electrode pads (bonding pads) are formed over the top wiring layer of the primary wiring layer, and the surface protective film has bonding holes which expose the electrode pads.

The secondary wiring layer is a layer (interposer) designed to arrange electrode pads with larger pitches than electrode pads in the primary wiring layer in order to match the pitches of electrode pads of a wiring board where a semiconductor device is mounted (mounting board). The electrode pads in the secondary wiring layer are electrically connected with the electrode pads in the primary wiring layer. Solder bumps are electrically and mechanically connected with the electrode pads in the secondary wiring layer.

An example of a wafer level CSP type semiconductor device is disclosed in Japanese Unexamined Patent Publication No. 2002-305285 (Patent Literature 1).

SUMMARY OF THE INVENTION

In the manufacture of a wafer level CSP type semiconductor device, a semiconductor wafer is segmented to produce individual semiconductor devices (the semiconductor wafer is divided along scribe lines to provide plural semiconductor chips, where each of the chips include an integrated circuit, plural first electrode pads and plural second electrode pads) before a burn-in (aging) step is taken. The burn-in step refers to a screening test (for rejection of devices with inherent defects or potential defect factors) in which the circuit of a semiconductor device is operated under more severe operating conditions (under load) than the customer's usual operating conditions (in a sense, the occurrence of defects is accelerated), with the result that a device which could be treated as defective in the customer's operating condition is rejected at the initial stage, or before shipment to the customer.

In the burn-in step, the semiconductor device is attached to a socket, and the semiconductor device and a burn-in board are electrically connected thorough the socket. Electrical connection between the socket and the semiconductor device is effected by pushing a solder bump of the semiconductor device against the contact pin of the socket. Due to friction at the time of this pressure contact, etc., some solder bump residues adhere to the contact pin. In the burn-in step, plural sockets are repeatedly used, and how many times one socket is used in a day depends on the semiconductor device production volume and the number of sockets in use. One socket may be used several hundreds of times in a day. Each time the socket is used, solder bump residues are accumulated on the contact pin.

Solder bump residues accumulated on the contact pin peel off of the contact pin and, for some reason, adhere to the semiconductor device's mounting surface (surface which faces the substrate during mounting) as foreign matter. Also, solder bump residues which are produced by friction due to contact pressure, etc. adhere to the semiconductor device's mounting surface as foreign matter for some reason.

The wafer level CSP type semiconductor device has a secondary wiring layer (rewiring layer) over the mounting surface, and the secondary wiring layer has plural wires (secondary wires) for electrical connection between the electrode pads in the primary wiring layer and those in the secondary wiring layer. These secondary wires are covered by an insulating layer formed above them. This insulating layer is very thin (for example, 2-3 µm) and the spacing between neighboring wires is small (10 µm or so). Therefore, the following problem may occur: foreign matter adhering to the semiconductor device's mounting surface, as mentioned above, might break and penetrate the insulating layer and touch a secondary wire, resulting in shorting of neighboring secondary wires.

Since adhesion of foreign matter in the burn-in step is unavoidable, removal of foreign matter at the final stage after the burn-in step is indispensable. With the conventional cleaning method, in which foreign matter is manually removed using vacuum tweezers, it has taken a lot of time to remove foreign matter (20 hours/K pieces). This has seriously lowered the working efficiency and contributed to a production cost increase. Besides, in manual removal of foreign matter, the removal performance is unstable, leading to a low product yield.

In the sorting (test) step after the burn-in step in the manufacture of a wafer level semiconductor device, an electrical characteristic evaluation test is conducted to check whether or not the semiconductor device works normally. In this characteristic evaluation test, the semiconductor device and a performance board (testing wiring board) are also electrically connected through a socket. In other words, foreign matter (solder bump residues) may adhere to the mounting surface of the semiconductor device in the sorting step as well.

Segmentation of a semiconductor wafer is usually carried out by dicing. In the manufacture of a chip level CSP type semiconductor device including a wire bonding step, a semiconductor wafer is segmented into plural semiconductor chips by dicing in a clean room. In the manufacture of a wafer level CSP type semiconductor device, a semiconductor wafer is also segmented into plural semiconductor chips by dicing in a clean room. Since steps after segmentation are carried out in a non-clean room, not only solder bump residues, but also other types of foreign matter may adhere to the mounting surface of the semiconductor device.

An object of the present invention is to provide a technique which reduces the cost of semiconductor devices.

Another object of the present invention is to provide a technique which improves the semiconductor device product yield.

The above and further objects and novel features of the invention will more fully appear from the following detailed description and the accompanying drawings.

Typical aspects of the present invention will be briefly outlined below.

(1) According to one aspect of the invention, a first method of manufacturing a semiconductor device has the steps of: producing plural product formation areas each having a circuit, and plural first electrode pads over a main surface of a semiconductor wafer; arranging plural second electrode pads with larger pitches than the first electrode pads in each of the product formation areas; segmenting the semiconductor wafer to separate the plural product formation areas, thereby providing plural semiconductor devices, each having the circuit, the plural first electrode pads and the plural second electrode pads over a first surface; and cleaning foreign matter off the first surface of the semiconductor device after the step of segmentation.

(2) According to the above item (1), the cleaning step is carried out by spraying plural powdered dry ice particles against the first surface of the semiconductor device.

(3) According to the above item (2), the particle size of the powder dry ice is in the range from 0.1 mm to 0.3 mm.

(4) The above item (1) further includes a step of making bumps over the second electrode pads in each of the product formation areas before the step of segmentation to separate the plural product formation areas.

(5) The above item (1) further includes a step of attaching the semiconductor device to a socket and carrying out burn-in.

(6) According to the above item (5), the step of segmentation to separate the plural product formation areas is carried out in a clean room, and the burn-in step is carried out in a non-clean room.

(7) The above item (1) further includes a step of attaching the semiconductor device to a socket and conducting a characteristic evaluation test.

(8) According to the above item (7), the step of segmentation to separate the plural product formation areas is carried out in a clean room, and the characteristic evaluation test is conducted in a non-clean room.

(9) According to another aspect of the invention, a method of manufacturing a semiconductor device includes the steps of: preparing a multi-device substrate which has plural product formation areas marked off by partitioning areas, each of the product formation areas having a first surface and a second surface disposed opposite each other and plural electrode pads arranged over the second surface; mounting a semiconductor chip over the first surface of each of the plural product formation areas; using a resin sealer to collectively resin-seal the plural semiconductor chips mounted in the plural product formation areas; producing plural semiconductor devices by dividing the resin sealer and the multi-device substrate into plural pieces, the semiconductor devices each having a wiring board including the product formation area, the semiconductor chip mounted over a first surface of the wiring board, and the resin sealer which resin-seals the semiconductor chip; and cleaning foreign matter off the first surface of the wiring board and the second surface opposite to it.

(10) According to the above item (9), the cleaning step is carried out by spraying plural powdered dry ice particles against the first surface of the semiconductor device.

(11) According to the above item (10), the particle size of the powdered dry ice is in the range from 0.1 mm to 0.3 mm.

(12) The above item (9) further includes a step of: making bumps over the second electrode pads in each of the product formation areas before the step of segmentation.

(13) The above item (9) further includes a step of attaching the semiconductor device to a socket and carrying out burn-in.

(14) The above item (9) further includes a step of attaching the semiconductor device to a socket and conducting a characteristic evaluation test.

Main advantageous effects which are brought about by the present invention are: reduction in semiconductor device cost and improvement in semiconductor device product yield.

DETAILED DESCRIPTION OF THE PREFERRED EMBODIMENTS

Figure 1:
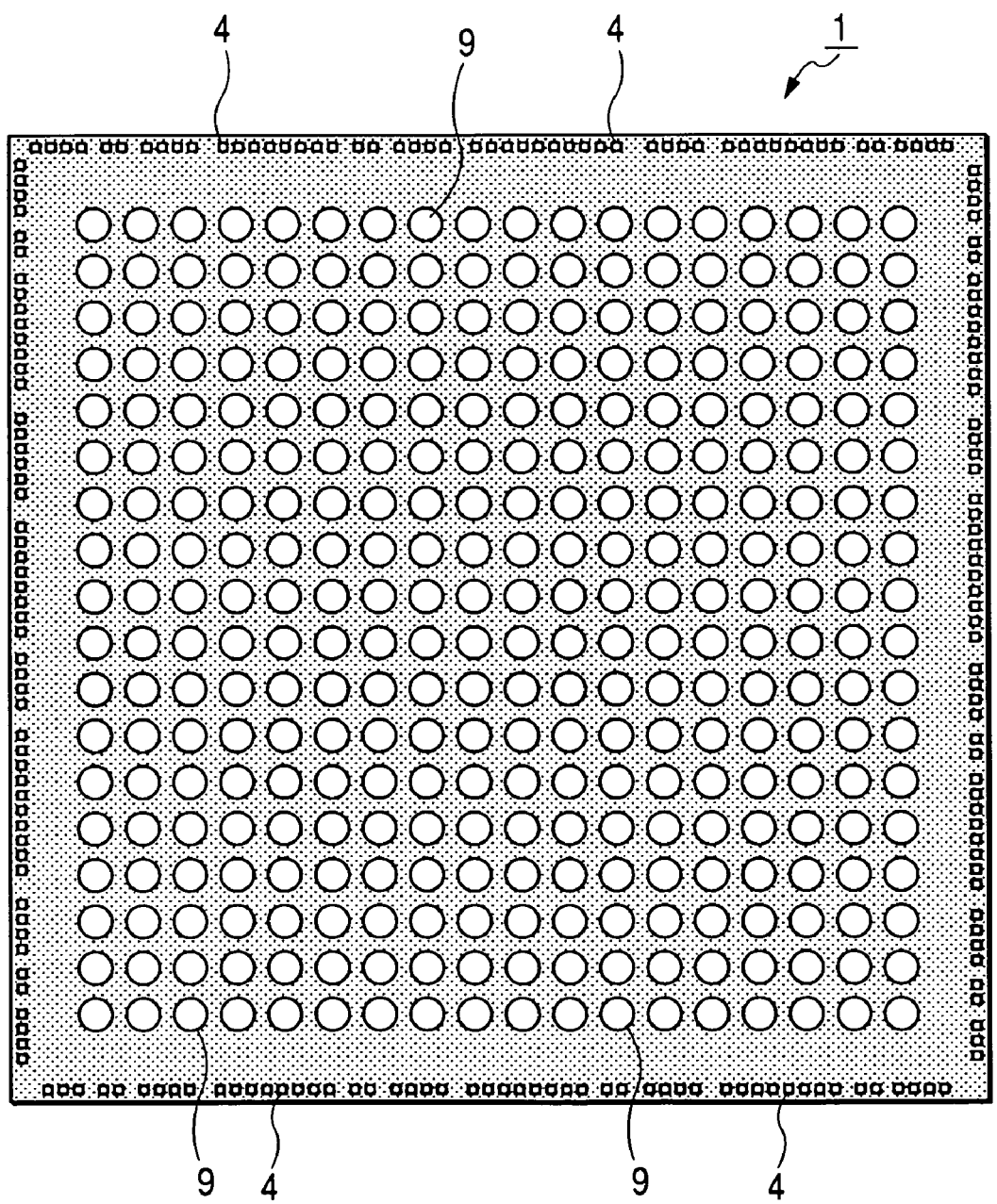
FIG. 1 is a diagrammatic plan view showing the mounting surface of a semiconductor device according to a first embodiment of the present invention.

Next, preferred embodiments of the present invention will be described in detail with reference to the accompanying drawings. In all of the drawings, elements with like functions are designated by like reference numerals and their descriptions are not repeated.

First Embodiment

Figure 2:
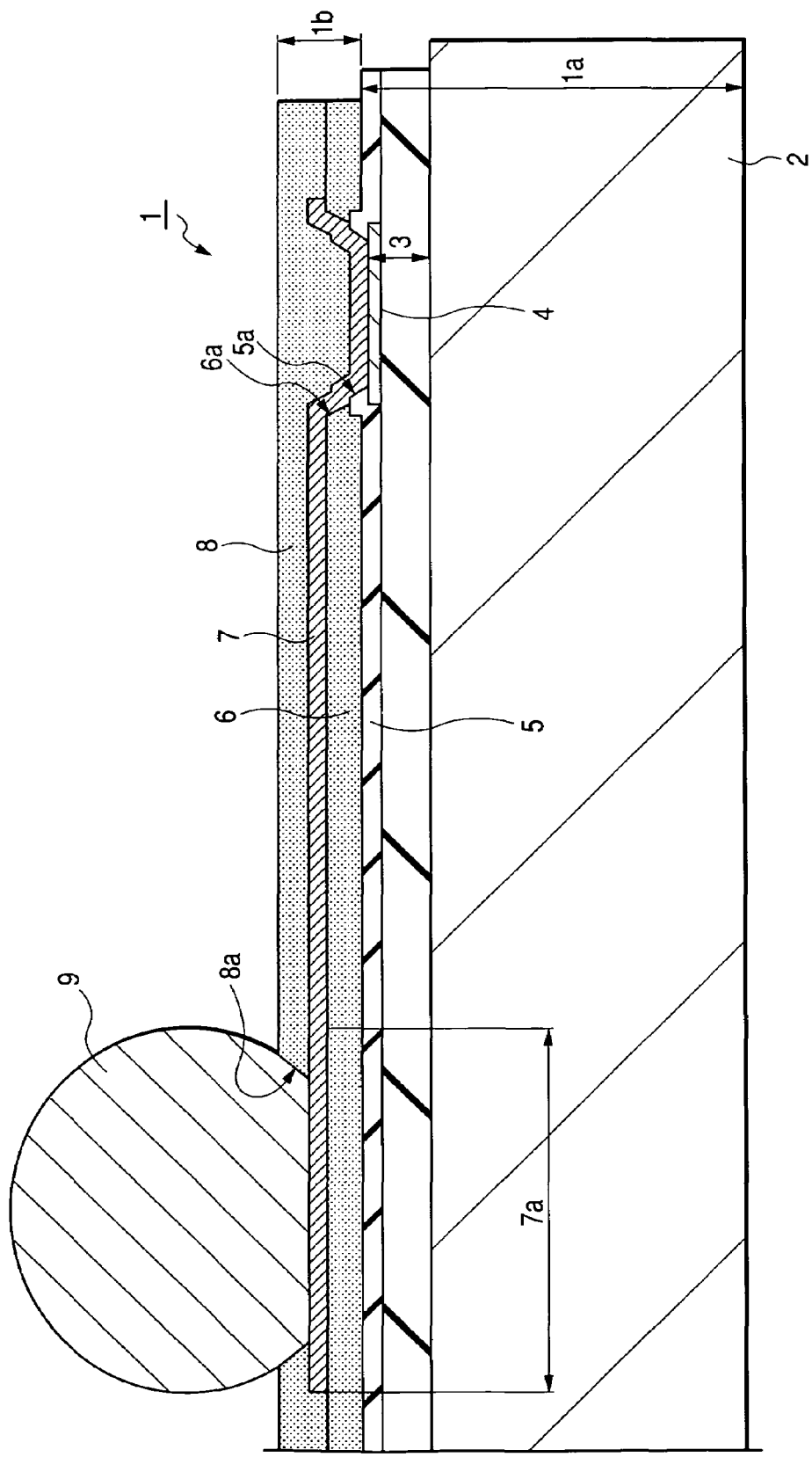
FIG. 2 is an enlarged diagrammatic sectional view showing the internal structure of a semiconductor device according to the first embodiment of the present invention.
Figure 3:
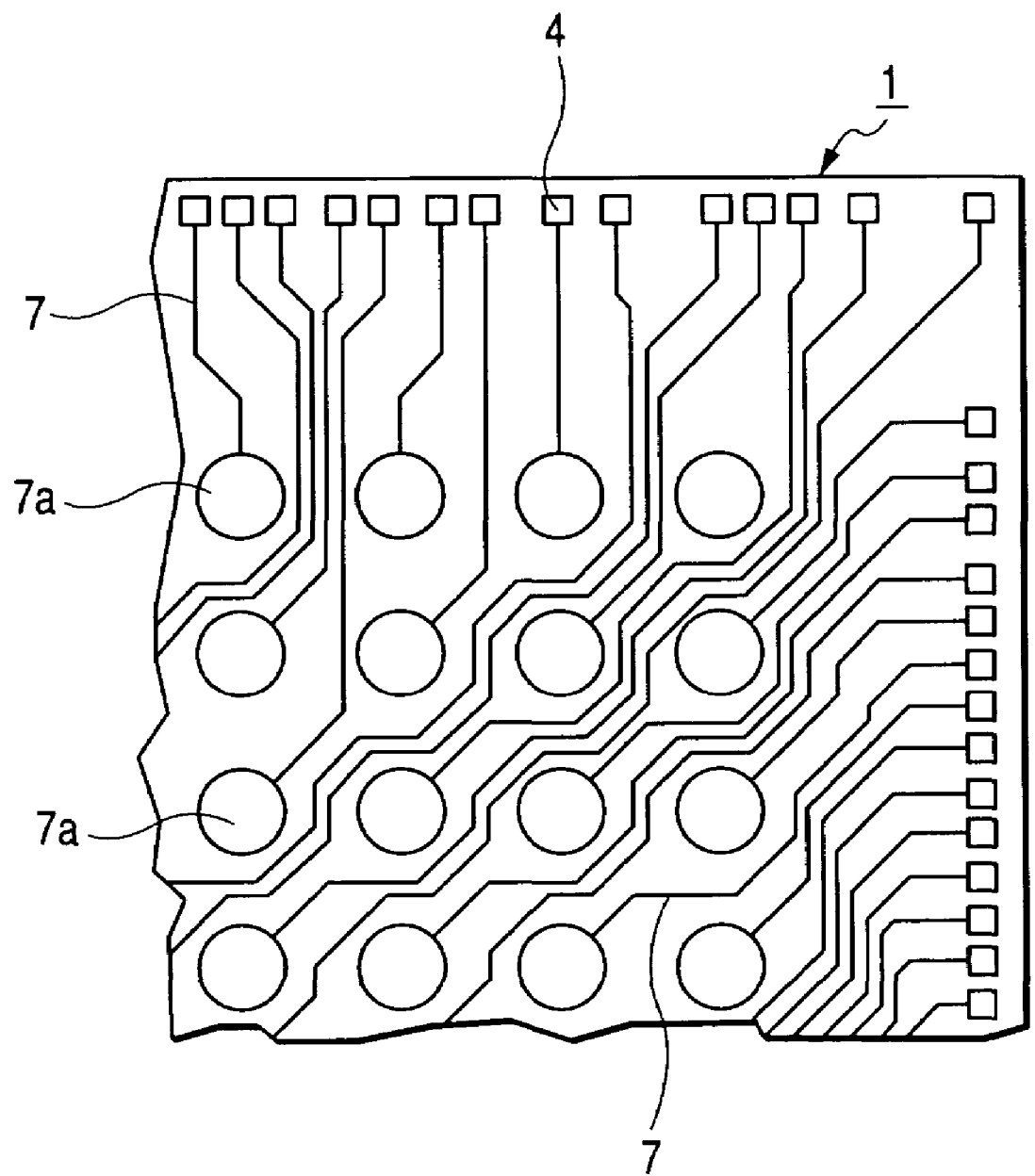
FIG. 3 is a diagrammatic plan view showing a wiring pattern on the mounting surface of a semiconductor device according to the first embodiment of the present invention.
Figure 4:
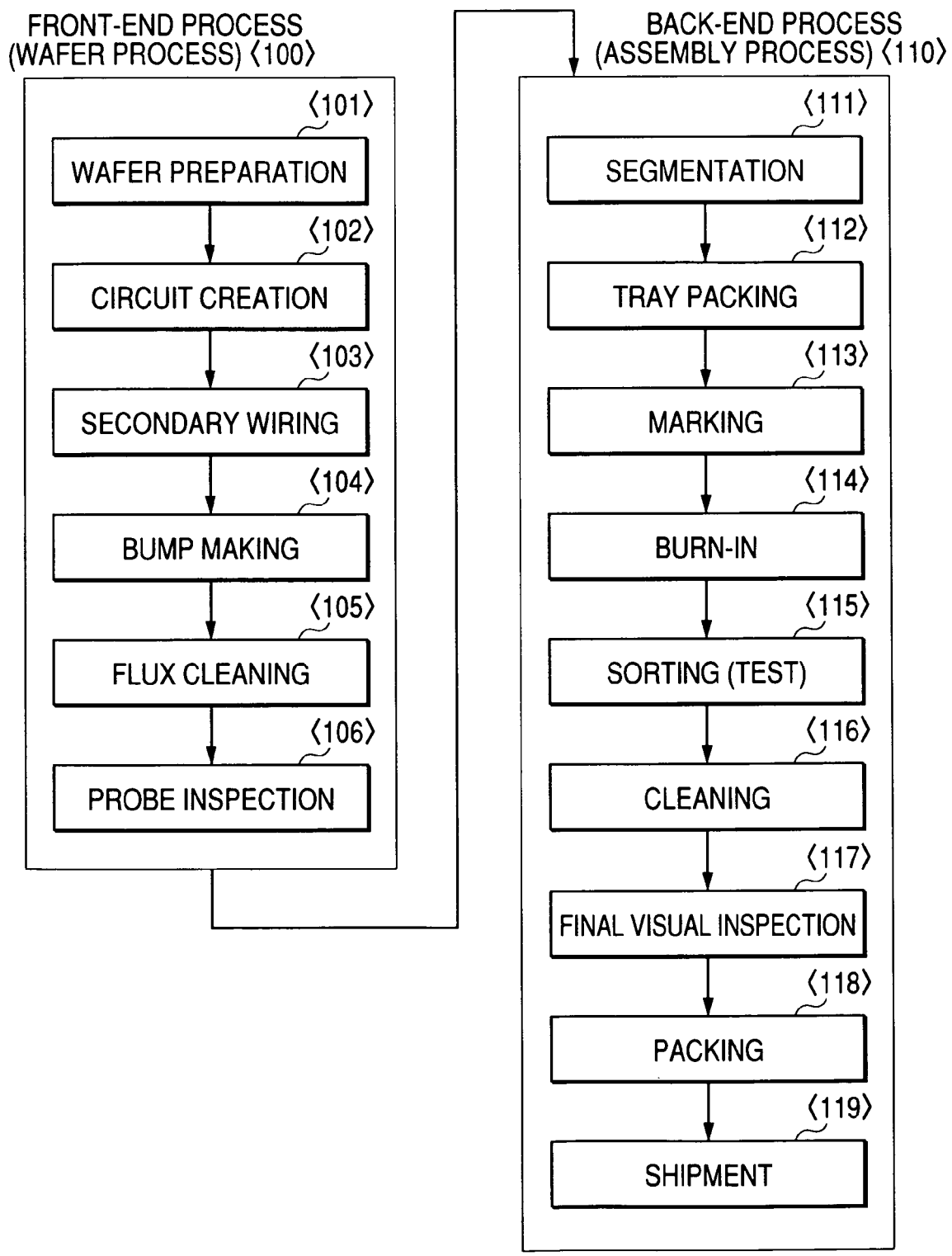
FIG. 4 is a flowchart showing the process of manufacturing a semiconductor device according to the first embodiment of the present invention.
Figure 5:
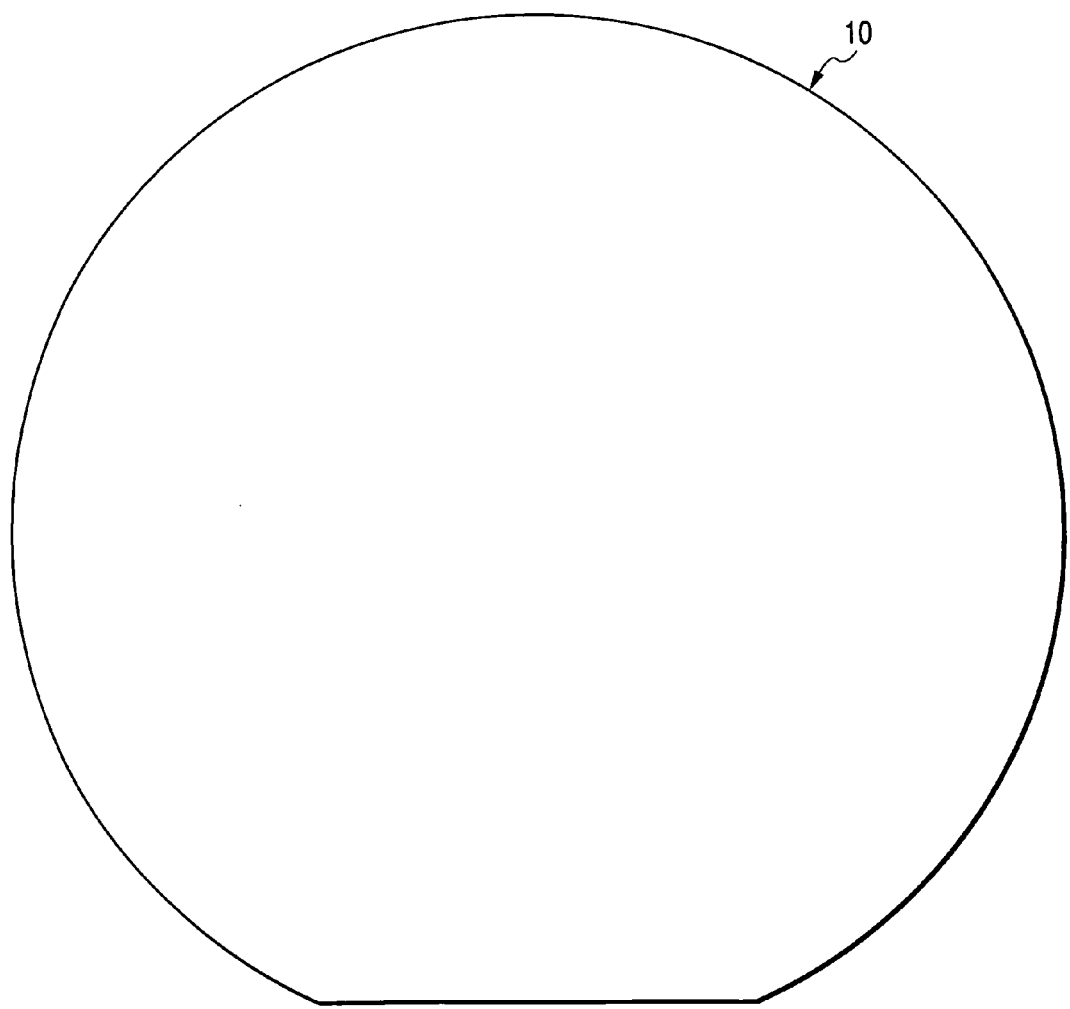
FIG. 5 is a plan view showing a semiconductor wafer used in the manufacture of a semiconductor device according to the first embodiment of the present invention.

The first embodiment concerns a wafer level CSP type semiconductor device to which the present invention is applied. FIG. 1 is a plan view showing the mounting surface of a semiconductor device according to this first embodiment of the present invention; FIG. 2 is a sectional view showing the internal structure of a semiconductor device according to the first embodiment of the present invention; FIG. 3 is a plan view showing a wiring pattern on the mounting surface of a semiconductor device according to the first embodiment of the present invention; FIG. 4 is a flowchart showing the process of manufacturing a semiconductor device according to the first embodiment of the present invention; FIG. 5 is a plan view showing a semiconductor wafer used in the manufacture of a semiconductor device according to the first embodiment of the present invention. FIG. 6 to FIG. 13 illustrate steps in the manufacture of a semiconductor device according to the first embodiment of the present invention.

Figure 14:
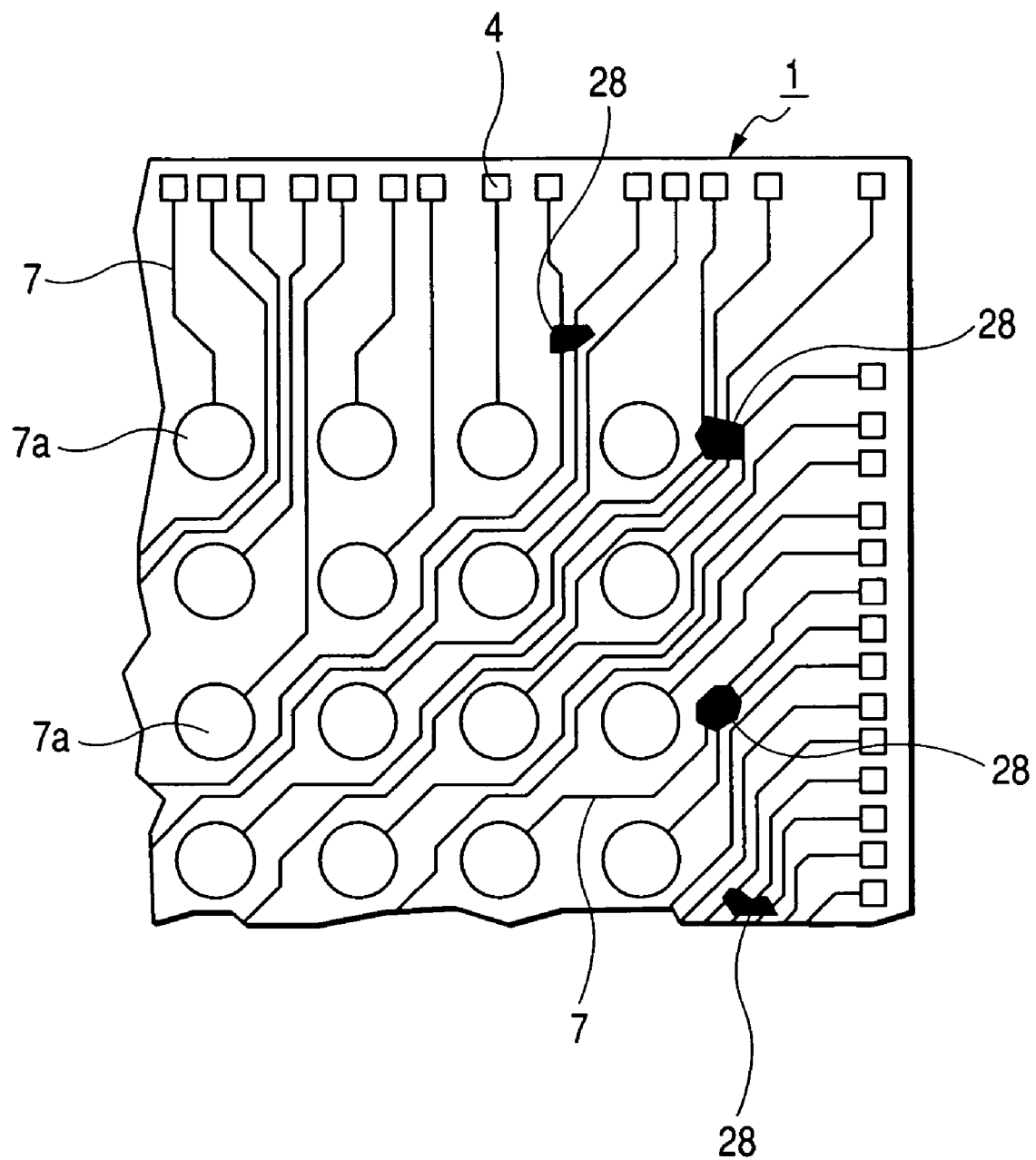
FIG. 14 is a schematic pan view showing foreign matter adhering to the mounting surface of a semiconductor device.

For simple illustration, the solder bumps as shown in FIG. 2 are omitted in FIG. 3 and FIG. 14.

As shown in FIGS. 1 and 2, the flat surface of a wafer level CSP type semiconductor device 1 is square (in this embodiment, it is a 11.0 mm square). As shown in FIG. 2, the semiconductor device 1 mainly includes: a chip layer 1a which corresponds to a semiconductor chip; a rewiring layer (secondary wiring layer) 1b formed over the main surface (circuit formation surface) of the chip layer 1a; and plural solder bumps (protruding electrodes) 9 over the rewiring layer 1b as external connection terminals.

The chip layer 1a includes a semiconductor substrate 2, a multilayer wiring layer (primary wiring layer) 3 formed as a laminate of plural insulating layers and plural wiring layers over the main surface of the semiconductor substrate 2, and a surface protective film 5 which covers the multilayer wiring layer 3. The semiconductor substrate 2 is, for example, made of monocrystal silicon; the insulating layers of the primary wiring layer 3 are, for example, made of silicon oxide; and the wiring layers of the primary wiring layer 3 are made of metal, such as aluminum (Al) or aluminum alloy or copper (Cu) or copper alloy. The surface protective film 5 is a multilayer film consisting of, for example, organic insulating layers and inorganic insulating layers of silicon oxide, silicon nitride or the like.

For example, plural electrode pads 4 (bonding pads) are formed as connectors over the main surface of the chip layer 1a. The plural electrode pads 4 are arranged along the sides of the chip layer 1a. The electrode pads 4 are formed in the top wiring layer of the primary wiring layer 3. The top wiring layer of the primary wiring layer 3 is covered by the surface protective film 5 disposed above it. The surface protective film 5a has bonding holes 5a which partially expose the surfaces of the electrode pads 4.

The flat surface of each electrode pad 4 is square (in this embodiment, it is a 50 μm square). The electrode pads 4 are arranged mostly at regular intervals of 40-65 μm.

As shown in FIGS. 2 and 3, a secondary wiring layer 1b mainly includes: an insulating layer 6 formed over the surface protective film 5; plural secondary wires 7 which extend over the insulating layer 6; plural electrode pads 7a disposed over the insulating layer 6; and an insulating layer 8 provided over the insulating layer 6, which covers the secondary wires 7.

One end of each of the secondary wires 7 is electrically connected with a corresponding one of the electrode pads 4 through the bonding hole 6a in the insulating layer 6 and the bonding hole 5a in the surface protective film 5. The other end of each of the secondary wires 7 is integrated with a corresponding one of the electrode pads 7a and is electrically connected with it.

The plural electrode pads 7a are arranged in a matrix pattern within the area surrounded by the plural electrode pads 4. The flat surface of each of the electrode pads 7a is, for example, circular (in this embodiment, it is a circle with a diameter of 0.2 mm or so). The plural electrode pads 7a are arranged with larger pitches than the electrode pads 4. In this first embodiment, they are arranged at intervals of 0.5 mm or so.

The electrode pads 7a are electrically and mechanically connected with plural solder bumps 9 through bonding holes 8a in the insulating layer 8, respectively. The solder bumps 9 are, for example, made of Sn—Ag—Cu metal alloy material (Pb-free).

The secondary wiring layer 1b is a layer (interposer) in which the electrode pads 7a are arranged with larger pitches than the electrode pads 4 in the primary wiring layer 3 according to the pitches of electrode pads on the wiring board where a semiconductor device is mounted (mounting board).

The insulating layers 6 and 8 of the secondary wiring layer 1b are made of a material with a lower elasticity than a silicon nitride film or silicon oxide film because the insulating layers 6 and 8 should minimize any concentration of stress on the solder bumps 9 which may be generated due to a difference in thermal expansion coefficient from the wiring board after the semiconductor device is mounted on the wiring board. In addition, they are thicker than the surface protective film. In this first embodiment, the insulating layers 6 and 8 are made of polyimide resin.

When the resistance, capacity and impedance of the secondary wiring 7 in the secondary wiring layer 1b are smaller than those of the wiring in the primary wiring layer, the electrode pads 7a can be arranged more freely. For example, in the first embodiment, the secondary wiring 7 is made of a Cu film with a high electric conductivity. In addition, it is desirable that the secondary wiring 7 be made of a thicker conductive film than the wiring in the primary wiring layer 3, and also that the insulating layer 8 which covers the secondary wiring 7 be made of an organic insulating film with a lower dielectric constant than the inorganic interlayer insulating film in the primary wiring layer 3.

Testing electrode pads which are used in the probe inspection step are provided over the secondary wiring 7, and the insulating layer 8 has holes which expose the surfaces of the testing electrode pads, though they are not shown here.

An integrated circuit is created over the main surface of the chip layer 1a. This integrated circuit mainly includes transistors formed over the semiconductor substrate main surface and wiring in the primary wiring layer 3.

Next, the process of manufacturing the semiconductor device 1 according to the first embodiment will be explained with reference to FIGS. 4 to 19.

As shown in FIG. 4, in the manufacture of the semiconductor device 1 according to the first embodiment, the steps from wafer preparation (101) to probe inspection (106) are collectively referred to as a front-end process (wafer process) (100) and the steps from segmentation (111) to shipment (119) are collectively called a back-end process (assembly process) (110).

As shown in FIG. 5, a semiconductor wafer 10, for example, made of monocrystal silicon is prepared (wafer preparation step 101 in FIG. 4).

Figure 6:
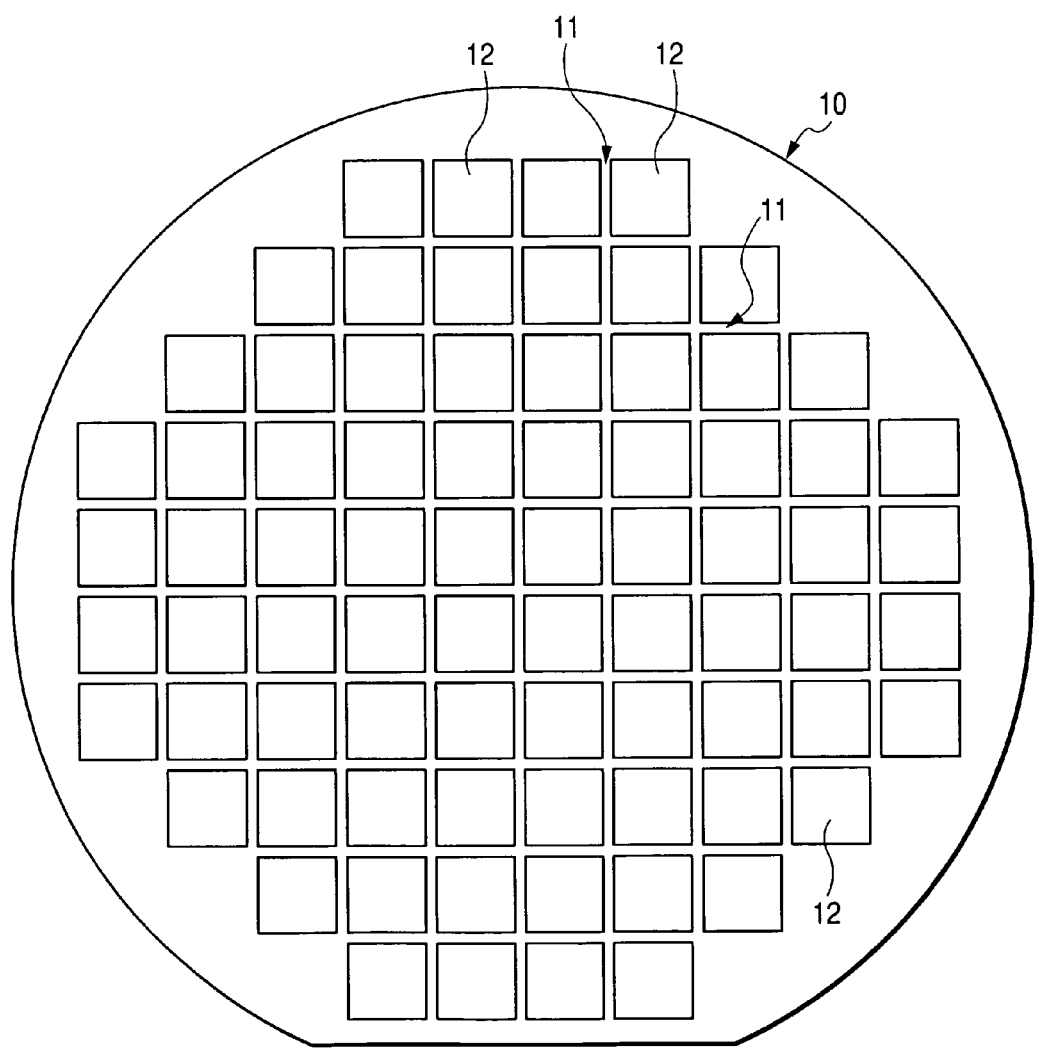
FIG. 6 is a plan view concerning steps in the manufacture of a semiconductor device according to the first embodiment of the present invention.
Figure 7:
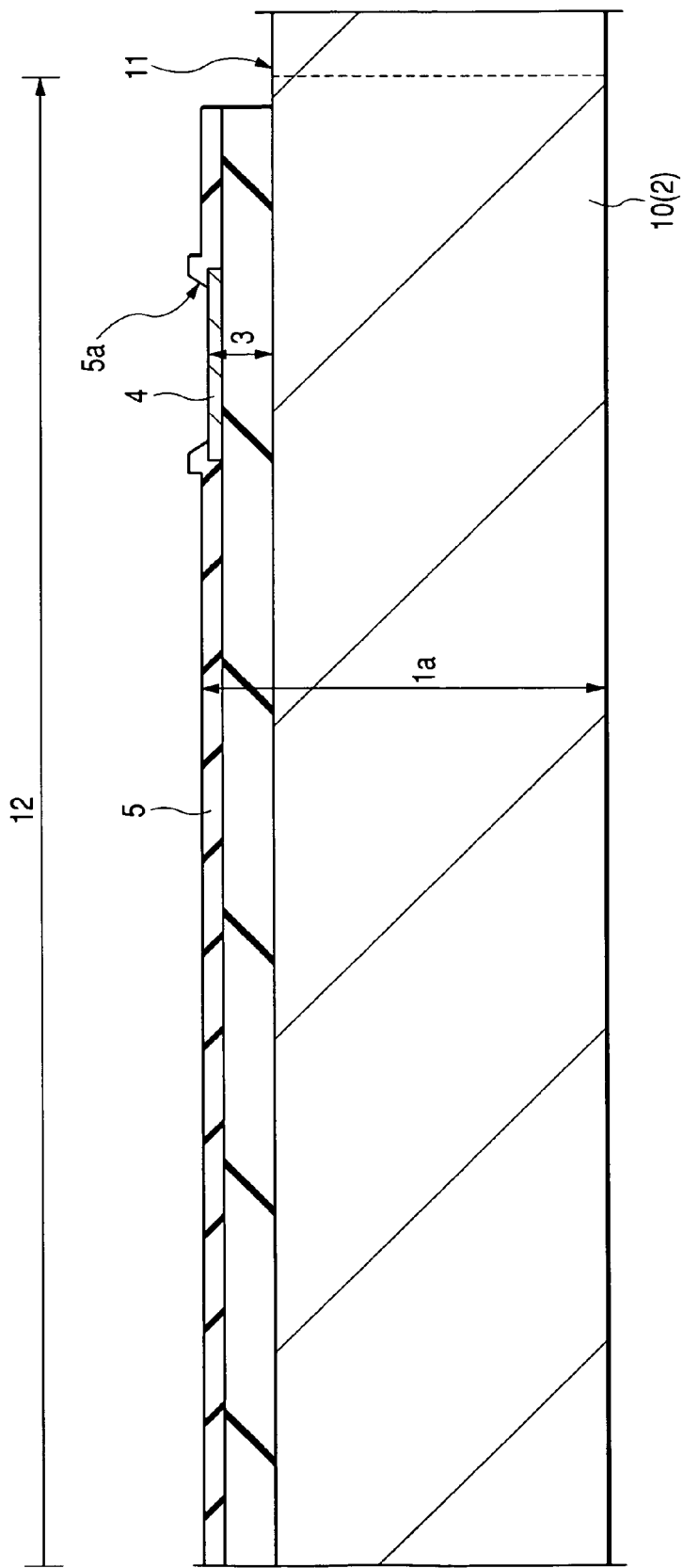
FIG. 7 is a sectional view concerning steps in the manufacture of a semiconductor device according to the first embodiment of the present invention.

Next, as shown in FIGS. 6 and 7, plural product formation areas (chip formation areas or device formation areas) 12 having a circuit and plural electrode pads 4 are formed in a matrix pattern over the main surface (circuit formation surface) of the semiconductor wafer 10 (circuit creation step 102 in FIG. 4). The plural product formation areas 12 are marked off by partitioning areas (scribe areas) 11 and are spaced apart from each other. The product formation areas 12 are mainly composed of transistors, a primary wiring layer (multilayer wiring layer) 3 with electrode pads 4, a surface protective film 5 and bonding holes 5a over the main surface of the semiconductor wafer 10.

Next, a secondary wiring layer (rewiring layer) 1b is formed in each product formation area 12 (secondary wiring step 103 in FIG. 4).

Figure 8:
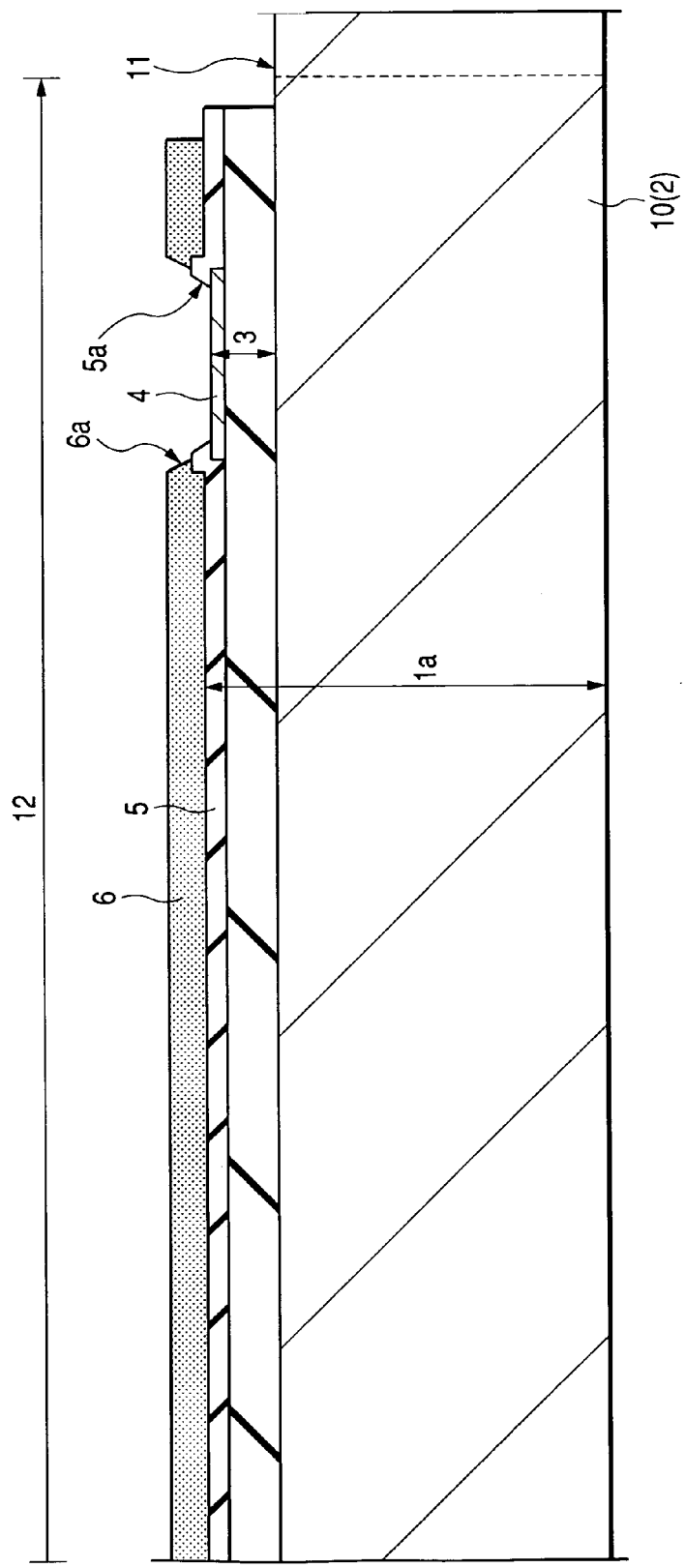
FIG. 8 is a sectional view showing steps (continued from the steps of FIG. 7) in the manufacture of a semiconductor device.

More specifically, an insulating layer 6, for example, of polyimide resin is formed over the whole surface of the surface protective film 5 by a rotary coating technique, and then a bonding hole 6a for exposing the surface of the electrode pad 4 is formed in the insulating layer 6, as shown in FIG. 8.

Figure 9:
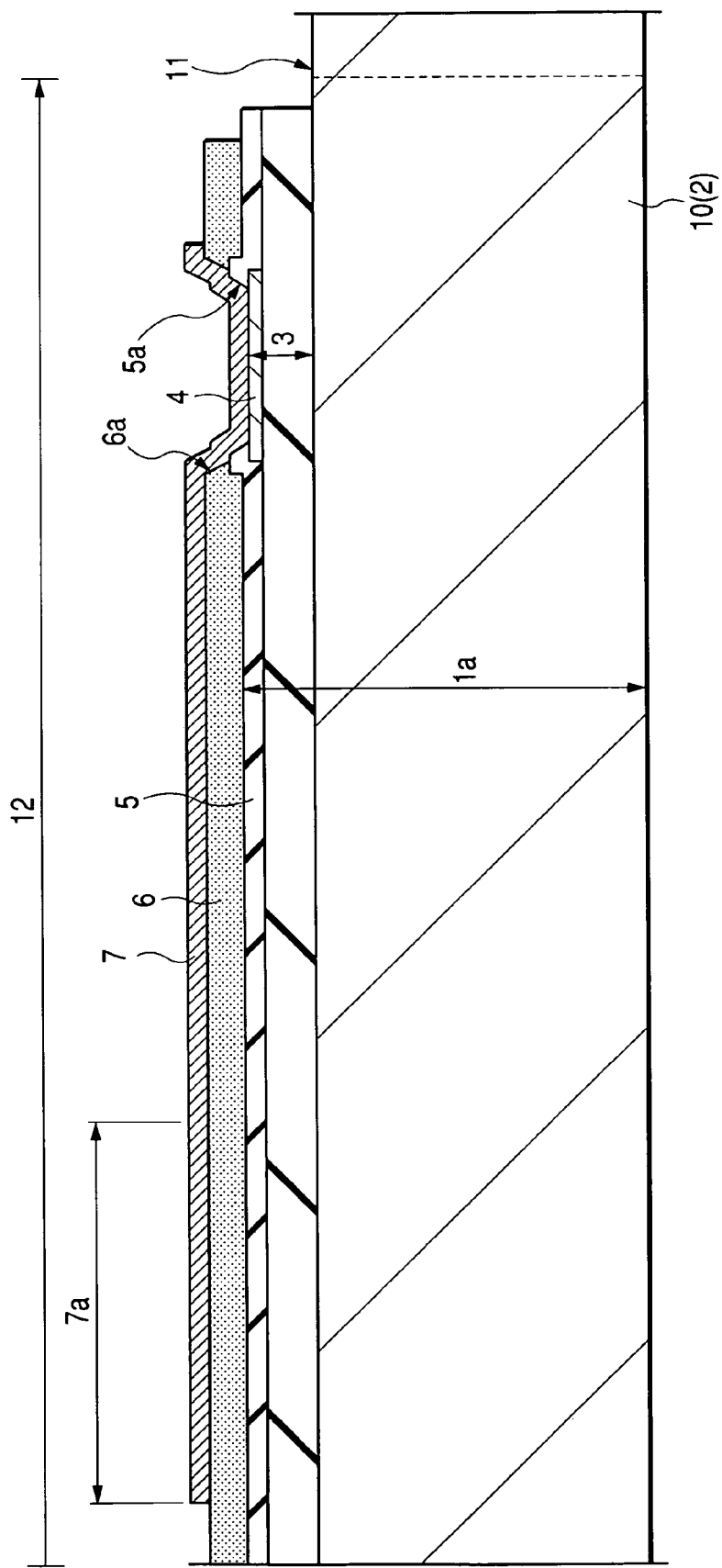
FIG. 9 is a sectional view showing steps (continued from the steps of FIG. 8) in the manufacture of a semiconductor device.

Next, for example, a copper (Cu) film to serve as a conductive film is formed over the whole surface of the insulating layer 6, including the inside of the bonding hole 6a, by low pressure CVD (Chemical Vapor Deposition) or sputtering, and then the copper film is patterned to form the secondary wiring 7 and an electrode pad 7a, as shown in FIG. 9.

Figure 10:
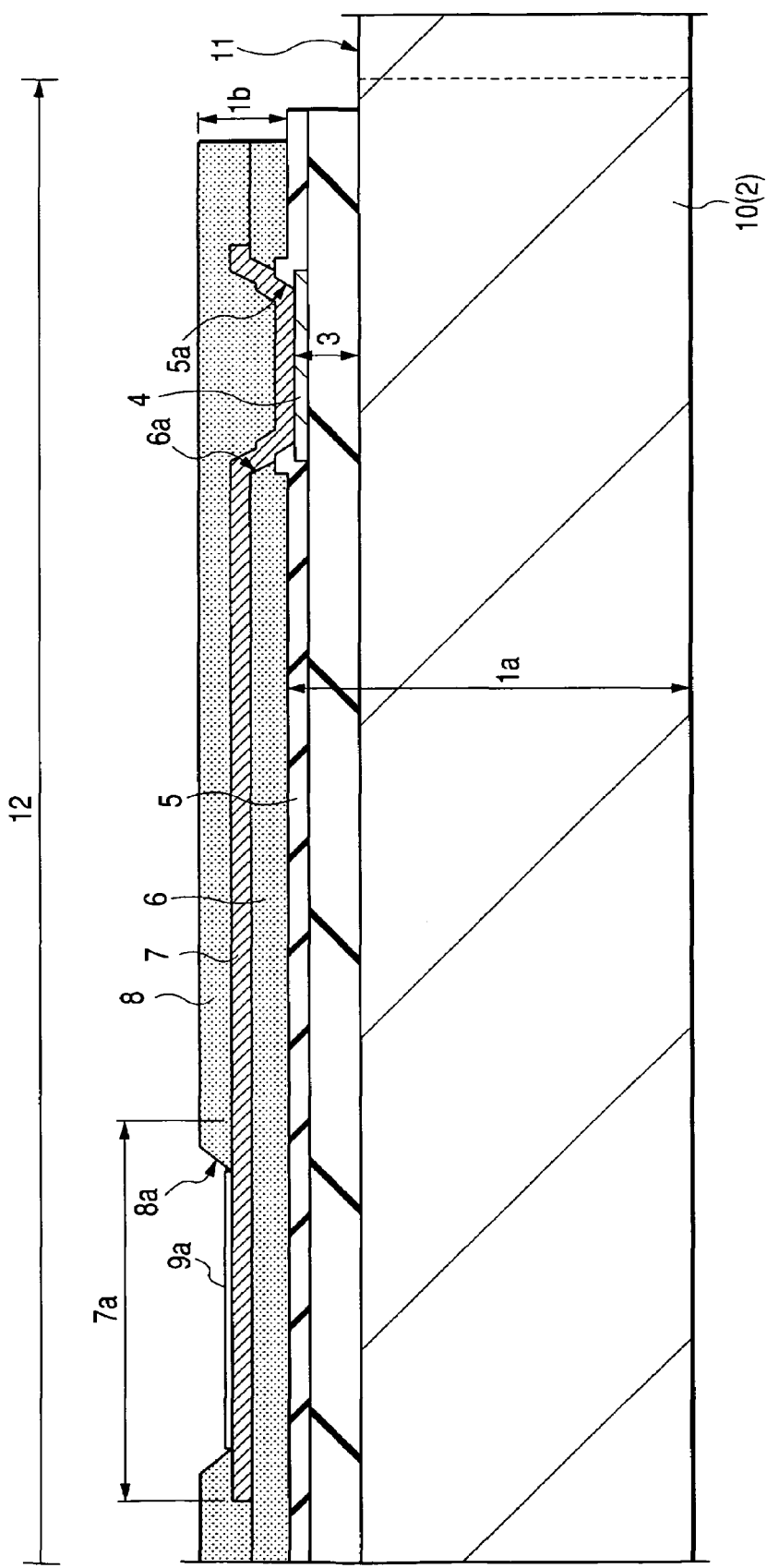
FIG. 10 is a sectional view showing steps (continued from the steps of FIG. 9) in the manufacture of a semiconductor device.

Next, an insulating layer 8, for example, made of polyimide resin is formed over the whole surface of the insulating layer 6, including the top of the secondary wiring 7, by a rotary coating technique, and then a bonding hole 8a for exposing the surface of the electrode pad 7a is formed in the insulating layer 8, as shown in FIG. 10.

Next, for example, an Au film 9a is formed over the surface of the electrode pad 7a that is exposed in the bonding hole 8a by a plating technique, as shown in FIG. 10. In this way, a secondary wiring layer 1b is completed in which electrode pads 7a are arranged with larger pitches than the electrode pads 4a.

Figure 11:
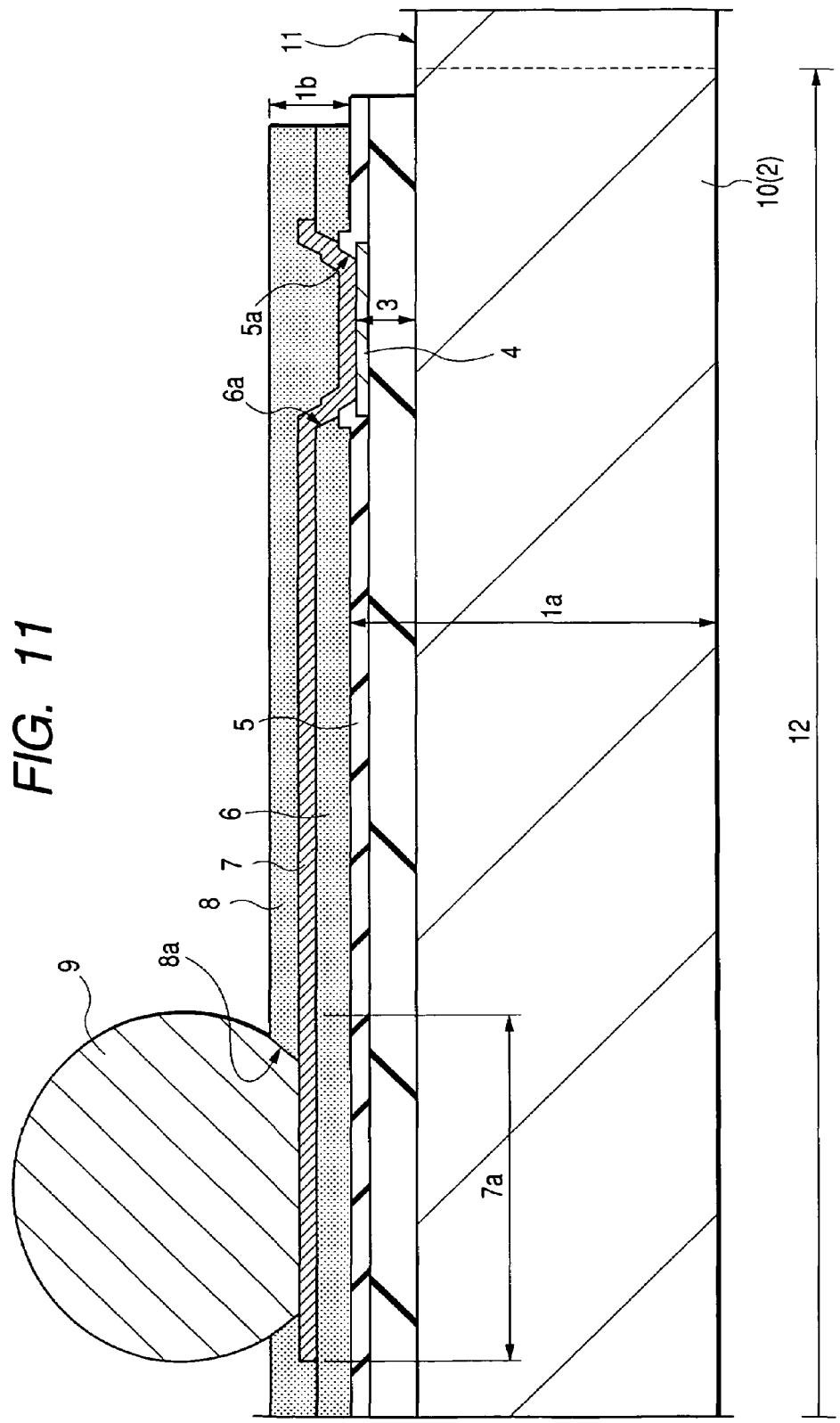
FIG. 11 is a sectional view showing steps (continued from the steps of FIG. 10) in the manufacture of a semiconductor device.

Next, a solder bump 9 is formed over the electrode pad 7a in each product formation area 12 of the semiconductor wafer 1, as shown in FIG. 11 (bump forming step 104 in FIG. 4). The method of making a solder bump 9 is not limited thereto. A second method is as follows: the electrode pad 7a is coated with flux, and then a solder ball is supplied to the electrode pad 7a by a ball supply method, then the solder ball is melted by an infrared reflow process. In a third method, solder paste is put on an electrode pad 9B by screen printing, and then the solder paste is melted by an infrared reflow process.

Next, the flux used in the solder bump making step (104) is cleaned away, and then the circuit function of each product formation area 12 is tested electrically using a probe card (probe inspection step 106 in FIG. 4). The probe inspection is carried out by pressing the probe needle of the probe card against the testing electrode pad provided at the secondary wiring 7 (probe inspection step 106).

Figure 12:
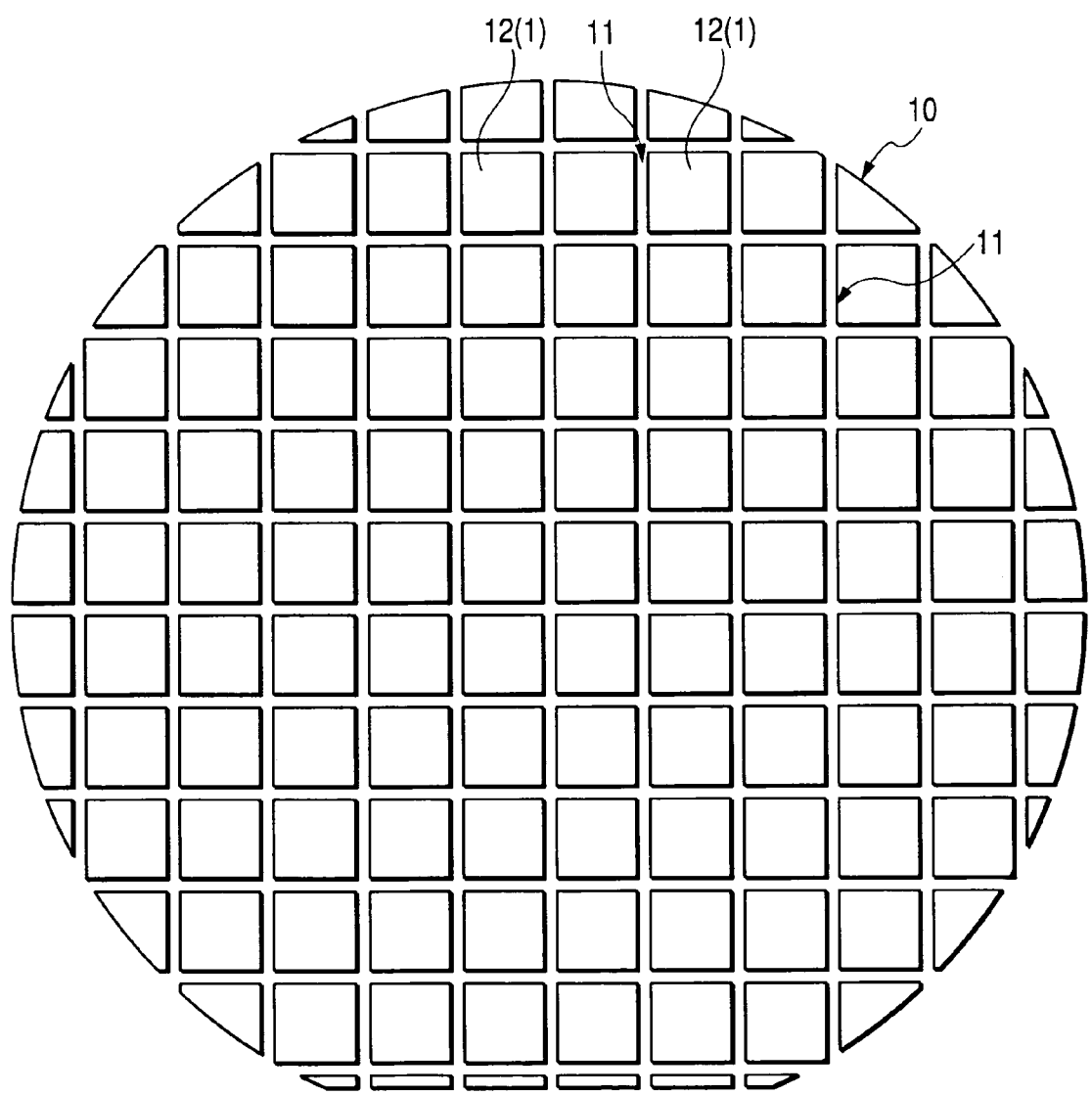
FIG. 12 is a sectional view showing steps (continued from the steps of FIG. 11) in the manufacture of a semiconductor device.
Figure 13:
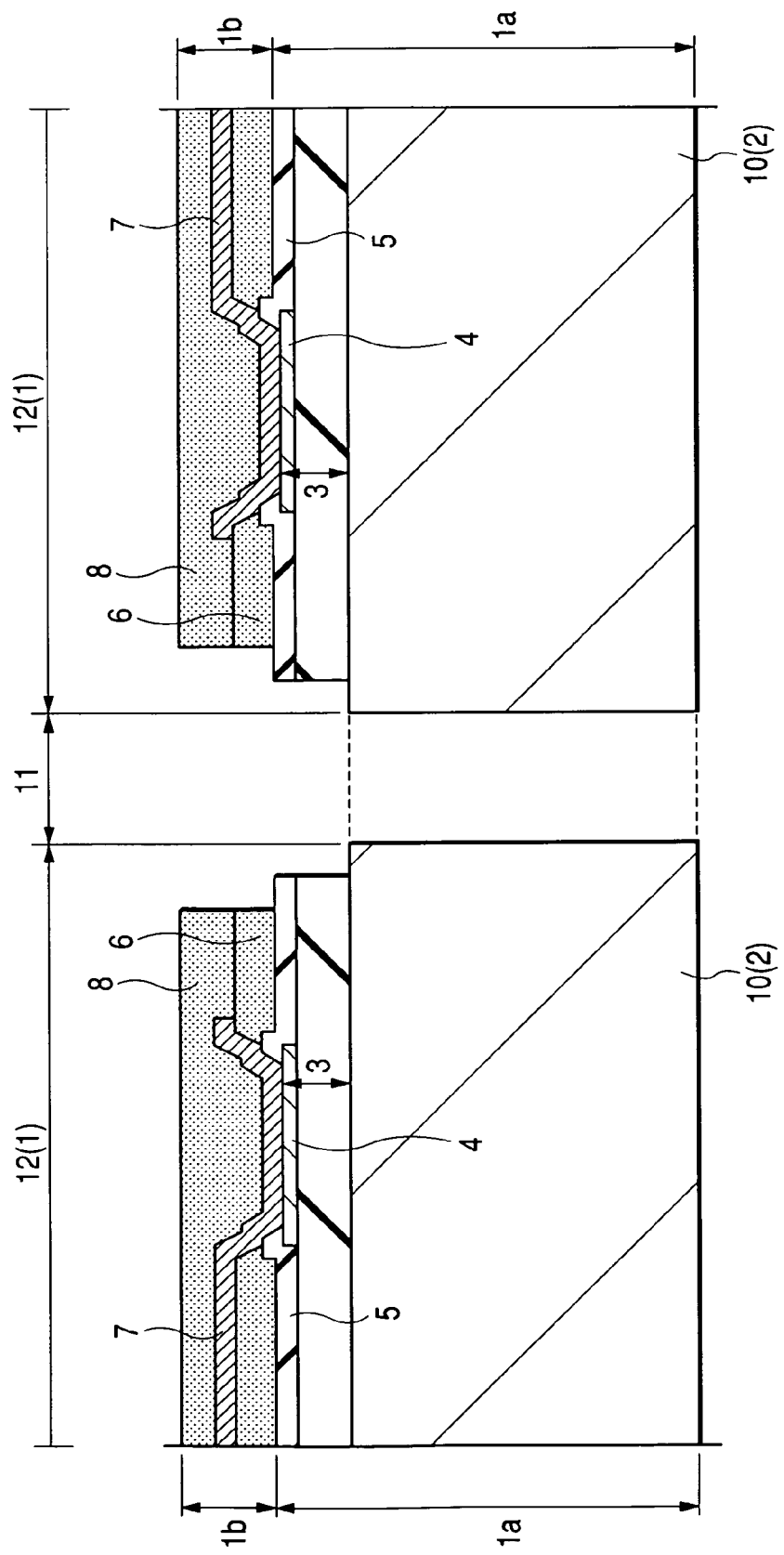
FIG. 13 is a sectional view showing steps (continued from the steps of FIG. 8) in the manufacture of a semiconductor device.

As shown in FIGS. 12 and 13, the semiconductor wafer 10 is segmented into plural pieces (segmentation step 111 in FIG. 4). This is achieved, for example, by dicing the semiconductor wafer 10 along the partitioning areas (scribe areas) 11 of the semiconductor wafer 10. This step is carried out in a clean room where there are not more than 1000 particles of foreign matter not larger than 0.5 μm in a cubic centimeter. With the abovementioned steps, the semiconductor device 1 according to the first embodiment (FIG. 1) is almost finished.

Next, the separate semiconductor devices 1 produced as a result of segmentation are packed in a tray (tray packing step 112 in FIG. 4), and then the semiconductor devices packed in the tray are transported to an area where the marking step is performed. In this step, an identification mark including a product name, company name, type, production lot number and other information is provided on the surface opposite to the mounting surface of each semiconductor device 1 (surface which faces the substrate during mounting) (marking step 113 in FIG. 4). This marking step is carried out by ink jet marking, direct printing, laser marking or a similar technique.

Next, the semiconductor device 1, which is packed in a tray, is transported to the burn-in area where a burn-in step is carried out on the semiconductor device 1 (burn-in step 114 in FIG. 4). In the burn-in step, the semiconductor device 1 is attached to a socket and electrically connected with a burn-in board through this socket. Electrical connection between the socket and the semiconductor device 1 is effected by pressing a solder bump 9 of the semiconductor device 1 against the contact pin of the socket. Due to friction in this pressure contact, etc., some solder bump residues adhere to the contact pin. In the burn-in step, plural sockets are repeatedly used and how many times one socket is used in a day depends on the semiconductor device production volume and the number of sockets in use. One socket may be used several hundreds of times in a day. Each time the socket is used, solder bump residues are accumulated on the contact pin.

Solder bump residues accumulated on the contact pin peel off the contact pin and, for some reason, adhere to the mounting surface of the semiconductor device 1 as foreign matter 28, as shown in FIG. 14. Also, solder bump residues which are produced by friction due to contact pressure, etc. adhere to the mounting surface of the semiconductor device 1 as foreign matter for some reason. For the wafer level CSP type semiconductor device 1 according to the first embodiment, although dicing for segmentation of the semiconductor wafer 10 into individual semiconductor devices 1 is carried out in a clean room, the steps after segmentation are carried out in a non-clean room. Hence, not only solder bump residues, but also other types of foreign matter, may adhere to the mounting surface of the semiconductor device 1.

Next, an electrical characteristic evaluation test is conducted to check whether or not the semiconductor device 1 works normally (sorting step 115 in FIG. 4). In this characteristic evaluation test, the semiconductor device 1 is attached to the socket and electrically connected with a performance board (testing wiring board) through the socket. Therefore, foreign matter (residues of solder bumps 36) may adhere to the mounting surface of the semiconductor device 1 in the sorting step as well.

Figure 15:
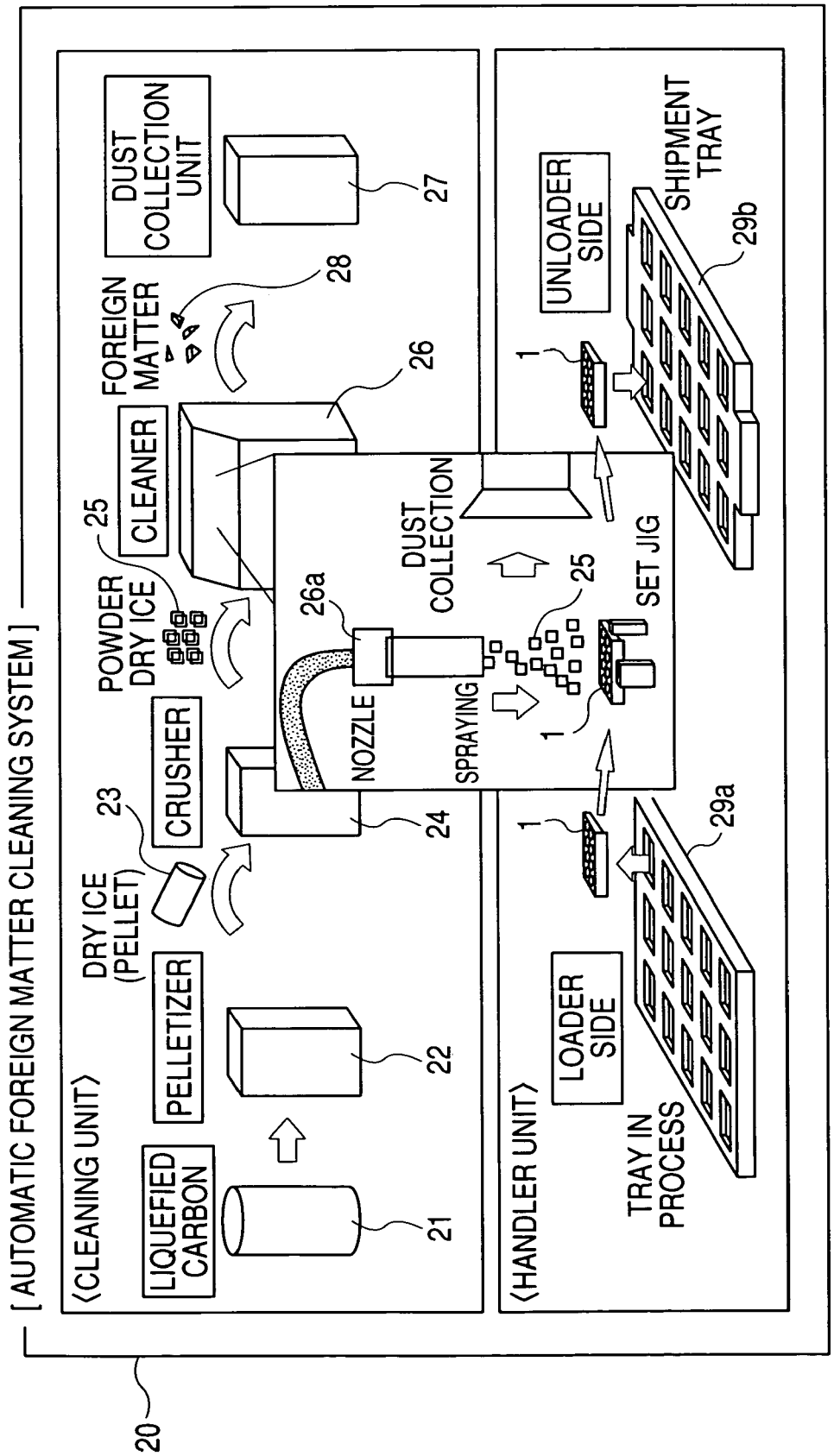
FIG. 15 shows the general structure of an automatic foreign matter cleaning system used for the manufacture of a semiconductor device according to the first embodiment of the present invention.

Next, foreign matter on the mounting surface of the semiconductor device 1 is removed by cleaning as follows. An automatic foreign matter cleaning system 20, as shown in FIG. 15, is employed for dry ice cleaning. In the automatic foreign matter cleaning system 20, liquefied carbon 21 is supplied to a pelletizer 22, which in turn produces pellets of dry ice 23; and the pellets of dry ice 23 are crushed into dry ice powder 25 by a crusher 24. In a cleaner 26, dry ice powder 25 is sprayed on the mounting surface of the semiconductor device 1 attached to a set jig through a nozzle 26a in order to remove foreign matter 28 from the mounting surface of the semiconductor device 1. The foreign matter 28 that is removed from the mounting surface of the semiconductor device 1 is collected in a dust collection unit 27. Semiconductor devices 1 are conveyed to the set jig from a tray 29a attached on the loader side one after another. The semiconductor devices 1 which have been subjected to the dry ice cleaning step are conveyed into a tray 29a on the unloader side.

Next, final visual inspection of the semiconductor device 1 is carried out (final visual inspection step 117 in FIG. 4). Then, the semiconductor device 1 is packed (step 118) and shipped as a product (step 119).

Figure 16:
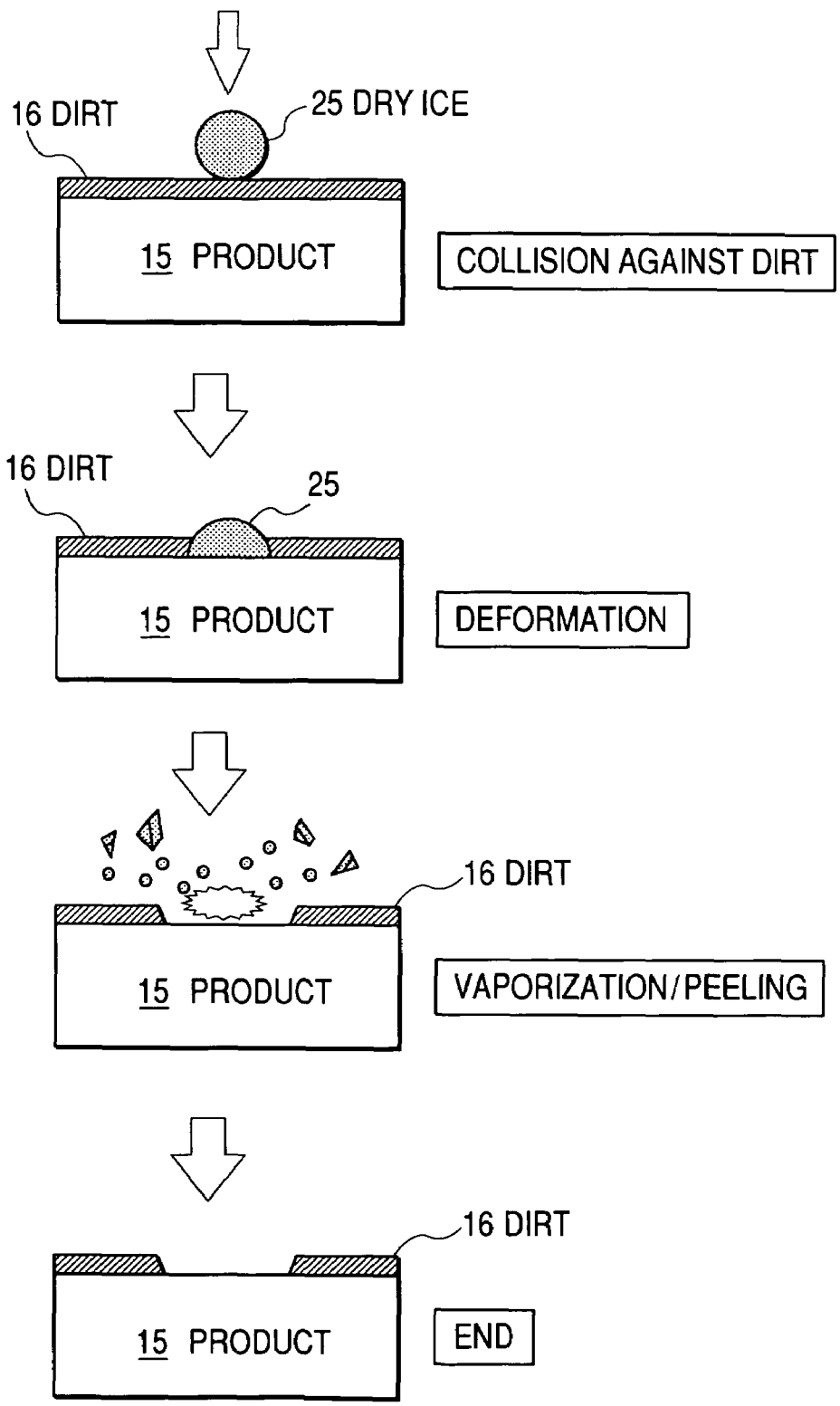
FIG. 16 is a diagram which illustrates the process of dry ice cleaning.
Figure 17:
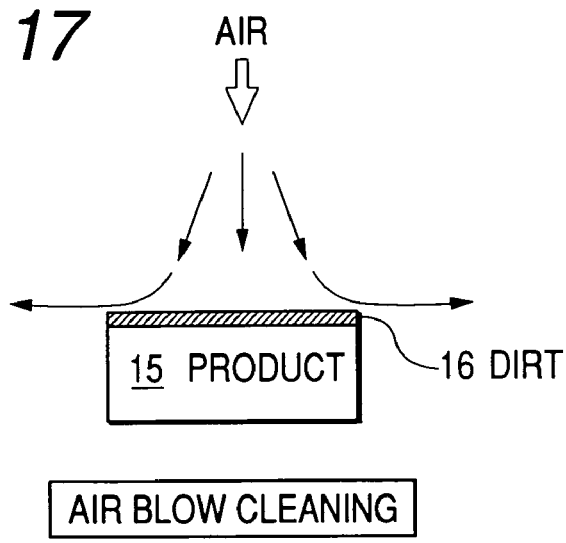
FIG. 17 is a diagram which illustrates the process of air blow cleaning.
Figure 18:
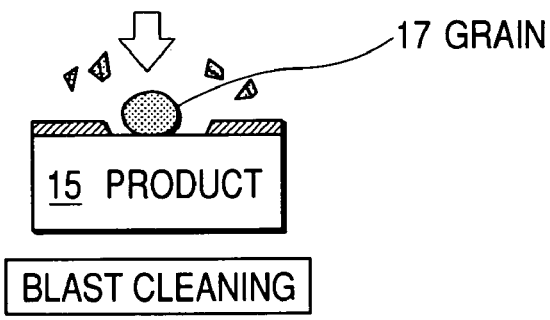
FIG. 18 is a diagram which illustrates the process of blast cleaning.

Next, dry ice cleaning will be explained with reference to FIG. 16.

Powdered dry ice 25 sprayed on the product through the nozzle 25a collides against dirt (foreign matter) and becomes deformed and evaporates. The dirt (foreign matter) peels off the product due to the impact for collision of powdered dry ice 25. The foreign matter removal performance of dry ice cleaning depends on the particle size of powdered dry ice 25, the pressure of the dry ice powder jet from the nozzle 26a, the distance from the nozzle 26a to the object, and other factors. According to the inventors' estimation, when the particle size of powdered dry ice is in the range from 0.1 to 0.3 mm, the jet pressure in the range from 0.5 to 2.0 kg/cm$^2$ and the spraying distance 30 mm, foreign matter adhering to the mounting surface of the semiconductor device 1 after the step of segmentation of the semiconductor wafer is removed in the shortest time.

In the conventional method of manufacturing a wafer level CSP type semiconductor device 1, foreign matter has been removed in the wafer processing (front-end process) by various cleaning methods, but the back-end process has included no automatic cleaning step for foreign matter removal. Particularly, in the conventional method, there has been no automatic cleaning step for foreign matter removal before final visual inspection (step 117). In comparison with manual foreign matter removal, automatic cleaning removes foreign matter quickly so that the time required to remove foreign matter can be shortened, and thus the cost of the semiconductor device 1 can be reduced. In addition, the foreign matter removal performance is stable, and the product yield of semiconductor devices 1 is improved.

In the first embodiment, dry ice is used in cleaning for foreign matter removal in the back-end process. Powdered dry ice sublimes after collision against foreign matter. Hence, washing and drying steps after foreign matter removal are no longer needed. This also contributes to a cost reduction in the production of the semiconductor devices 1, as well as an improvement in the product yield.

Cleaning for foreign matter removal in the back-end process 110 is carried out after the segmentation step 111 and before the shipment step 119. It is more desirable to do it after the segmentation step 111 and before the final visual inspection step 117. It is also more desirable to do it after the burn-in step 114 (where the sockets are used) or the sorting step 115, and before the final visual inspection step 117.

Figure 19:
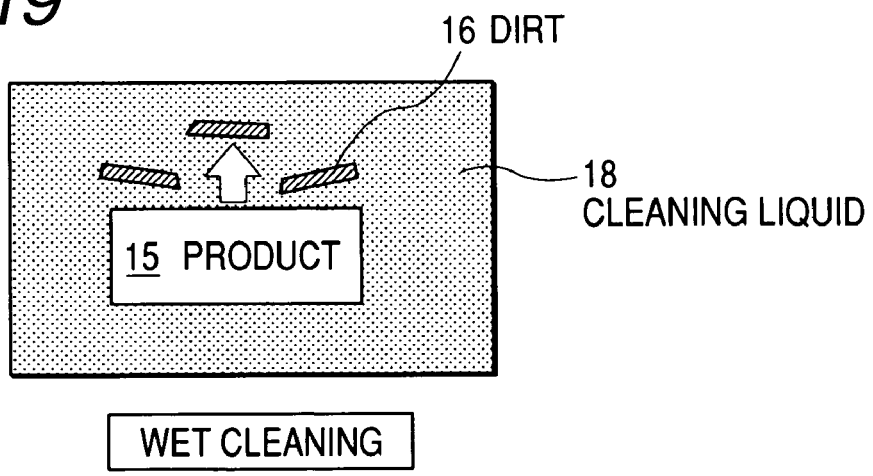
FIG. 19 is a diagram which illustrates the process of wet cleaning.

In the first embodiment, other cleaning methods may be used for foreign matter removal in the back-end process instead of dry ice cleaning. Such other cleaning methods include: air blow cleaning (FIG. 17), blast cleaning (FIG. 18) and wet cleaning (FIG. 19). In air blow cleaning, air is blown against the product 15 to remove foreign matter (dirt 16). In blast cleaning, glass or plastic grains 17 are blown to remove foreign matter (dirt 16). In wet cleaning, the product 15 is immersed in a cleaning chemical 18 to remove foreign matter (dirt 16). Although any of these methods may be used for foreign matter removal in the back-end process, they have the following drawbacks. In air blow cleaning, floating foreign matter can be removed, but foreign matter piercing the insulating layer 18 is hard to remove. In blast cleaning, the surface of the product may be abraded, and it is necessary to do washing to remove residual blast material which stays on the product. Also, the blast material must be checked for abrasion. In wet cleaning, it is necessary to wash and dry the product and do maintenance of the chemical to prevent its contamination. Hence, dry ice cleaning is more advantageous.

Second Embodiment

The second embodiment is directed to a chip level CSP type semiconductor device to which the present invention is applied.

Figure 20:
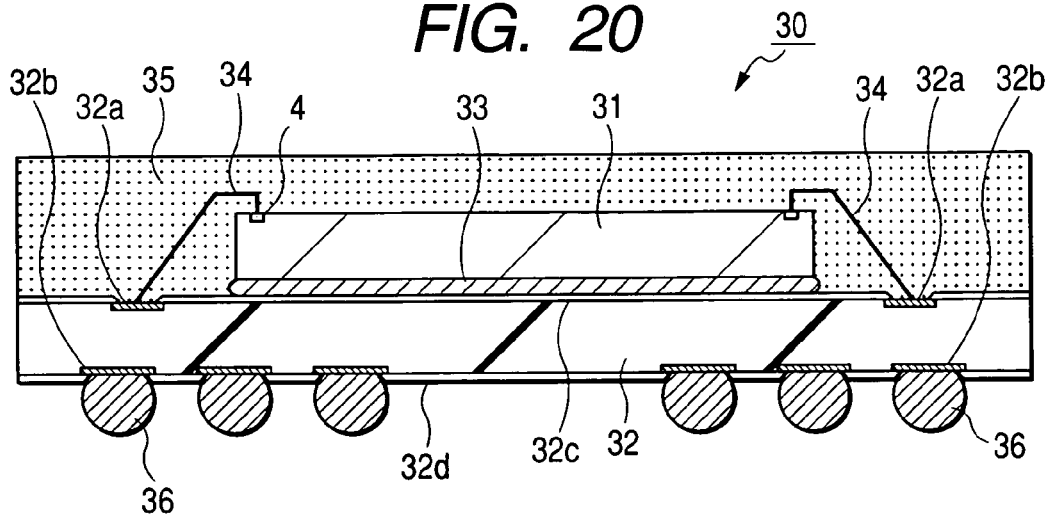
FIG. 20 is a schematic sectional view showing the internal structure of a semiconductor device according to a second embodiment of the present invention.
Figure 21:
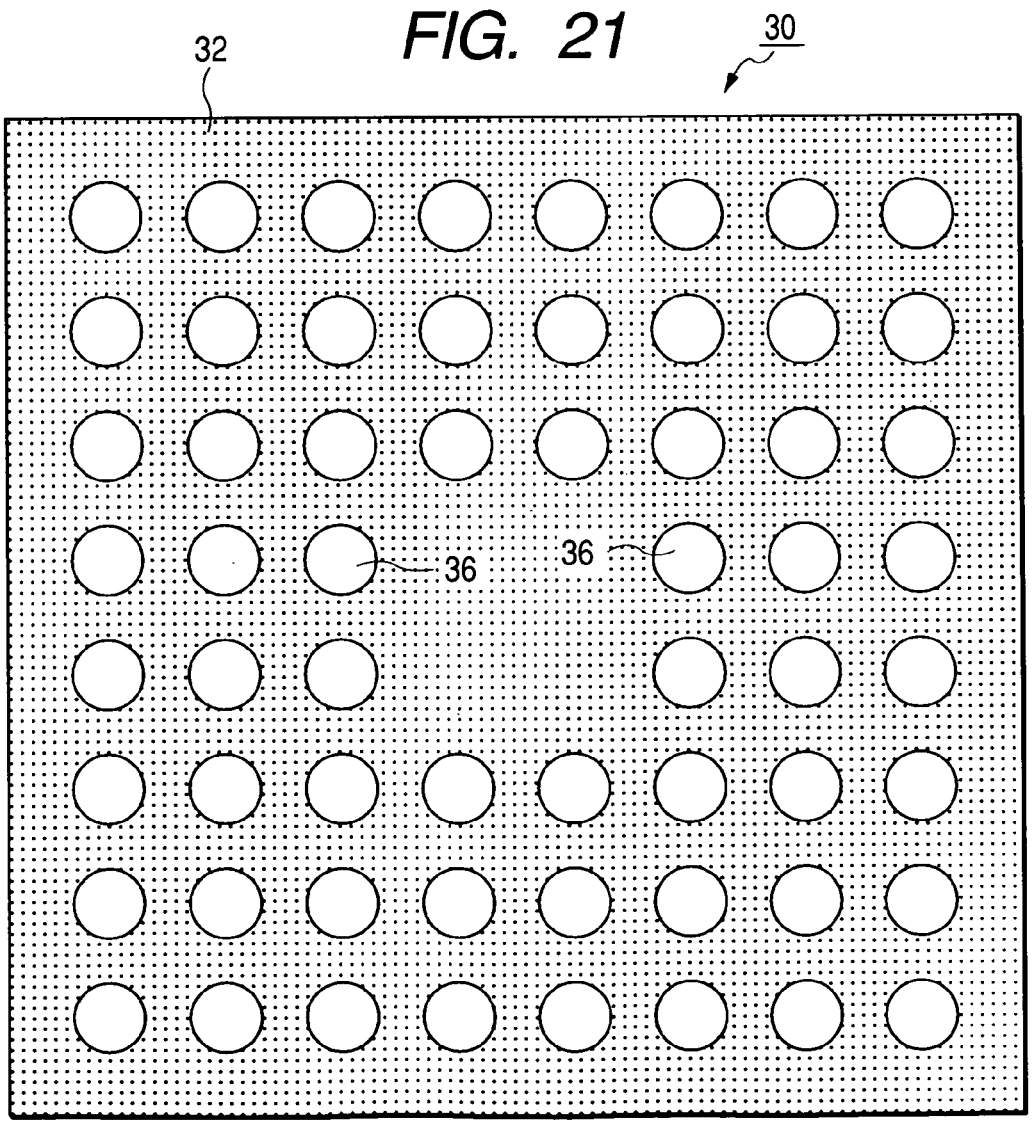
FIG. 21 is a plan view showing the mounting surface of a semiconductor device according to second embodiment of the present invention.
Figure 22:
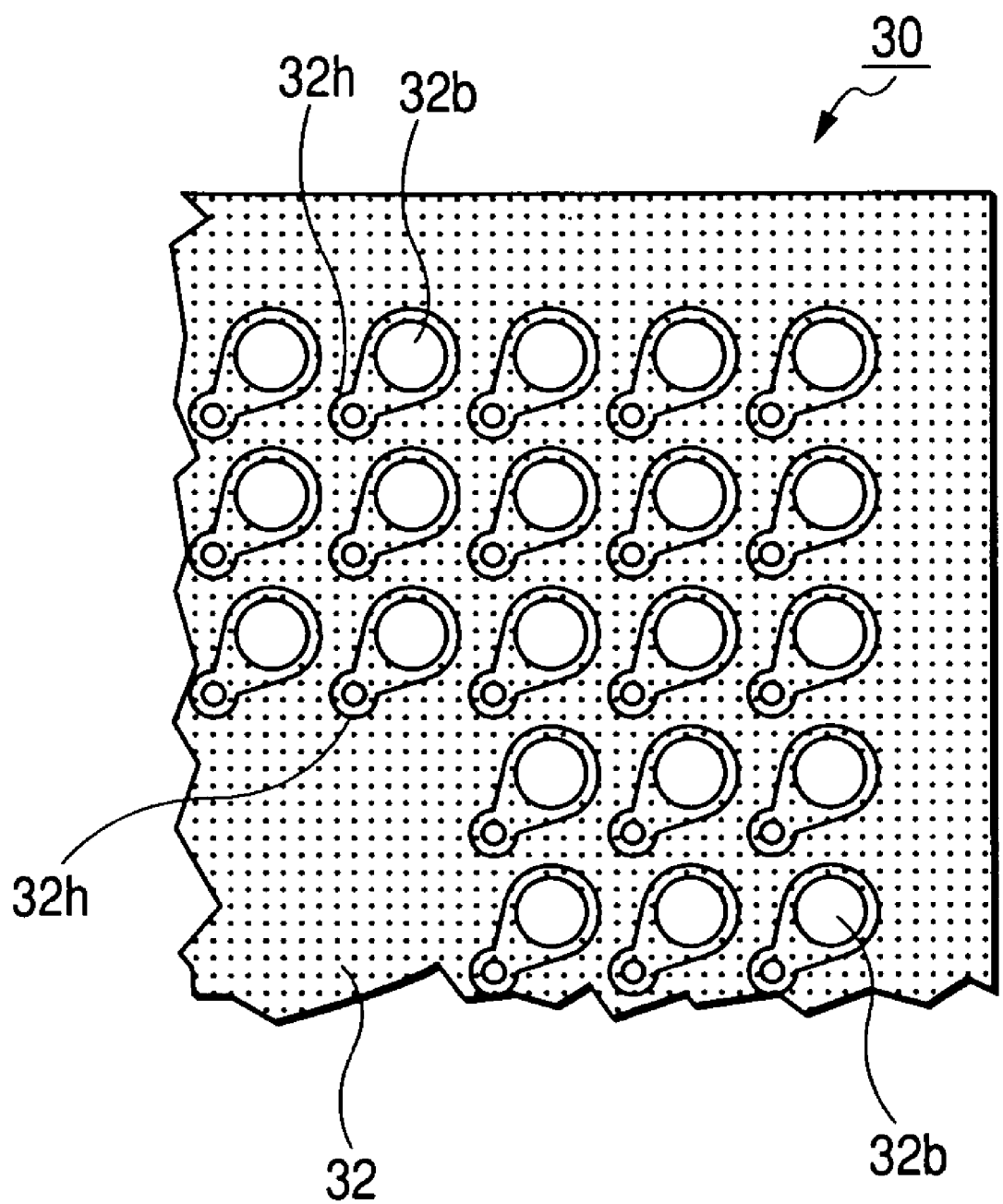
FIG. 22 is a plan view showing a wiring pattern on the mounting surface of a semiconductor device according to the second embodiment of the present invention.
Figure 23:
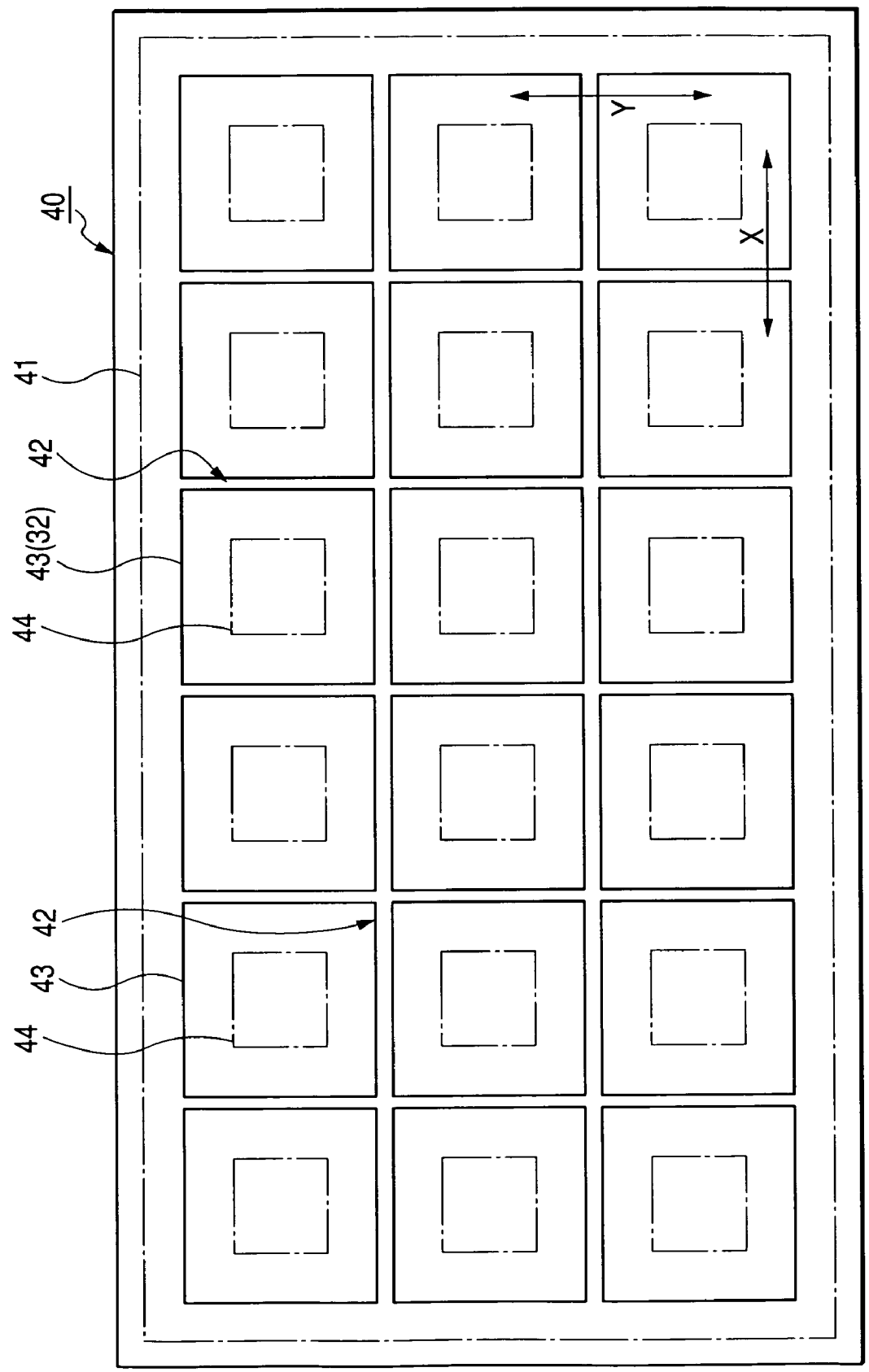
FIG. 23 is a plan view showing a multi-device substrate used in the manufacture of a semiconductor device according to the second embodiment of the present invention.
Figure 24:
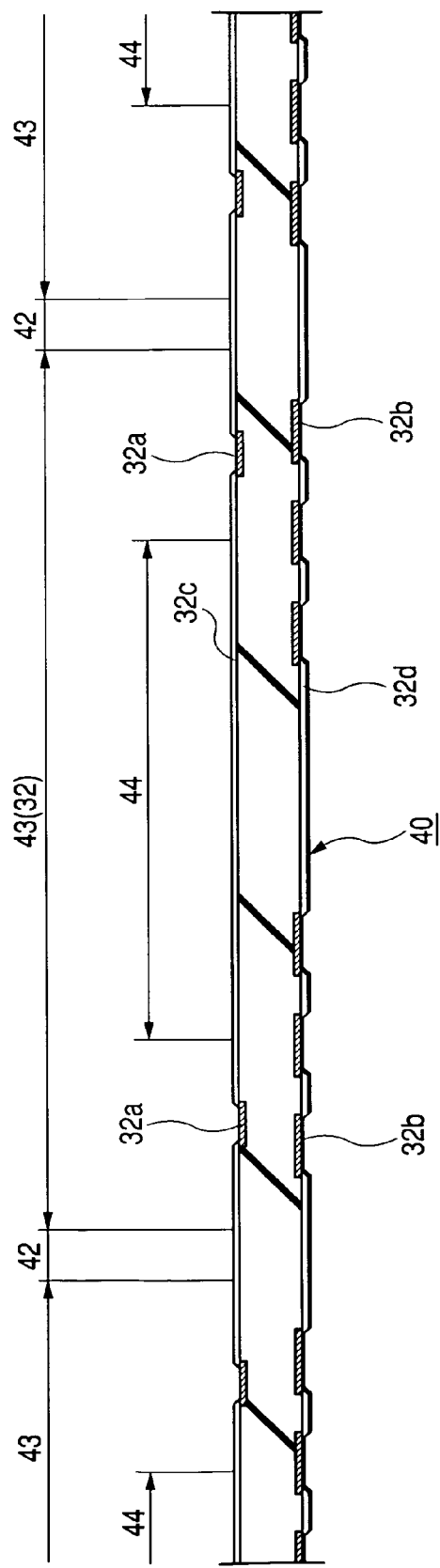
FIG. 24 is a sectional view concerning steps in the manufacture of a semiconductor device according to the second embodiment of the present invention.
Figure 25:
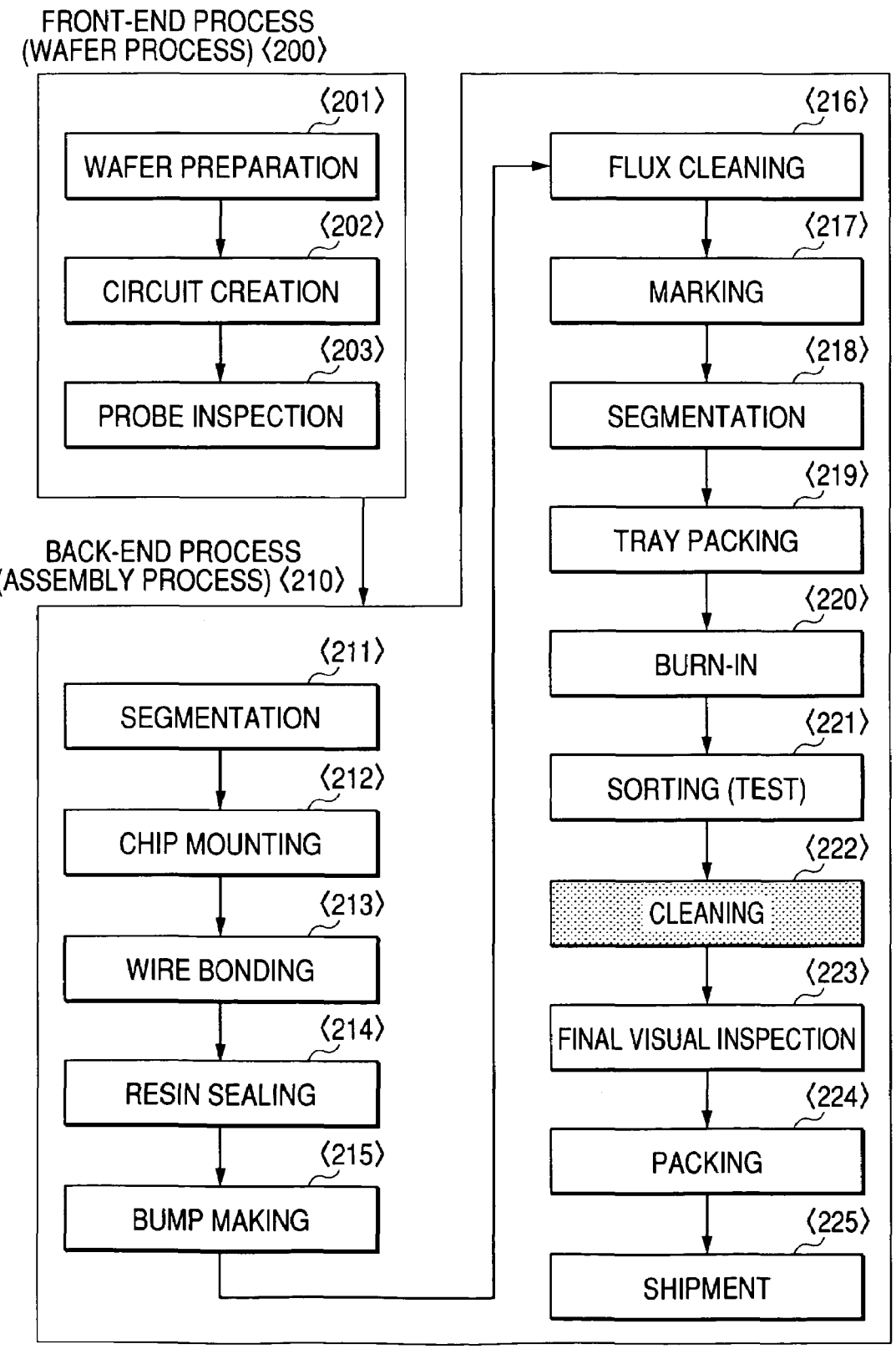
FIG. 25 is a flowchart showing the process of manufacture of a semiconductor device according to the second embodiment of the present invention.

FIG. 20 is a sectional view showing the internal structure of a semiconductor device according to a second embodiment of the present invention; FIG. 21 is a plan view showing the mounting surface of a semiconductor device according to the second embodiment of the present invention; FIG. 22 is a plan view showing a wiring pattern on the mounting surface of a semiconductor device according to the second embodiment of the present invention FIG. 23 is a plan view showing a multi-device substrate used in the manufacture of a semiconductor device according to the second embodiment of the present invention; FIG. 24 is a sectional view of the multi-device substrate in FIG. 23; FIG. 25 is a flowchart showing the process of manufacturing a semiconductor device according to the second embodiment of the present invention; and FIGS. 26 to 30 show steps in the manufacture of a semiconductor device according to the second embodiment of the present invention.

For simple illustration, the solder bumps as shown in FIG. 21 are omitted in FIG. 22.

As shown in FIGS. 20 and 21, the semiconductor device 30 according to the second embodiment has a package structure in which a semiconductor chip 31 is mounted over the main surface (first surface) of a wiring board 32, called an interposer, and, as protruding electrodes, for example, plural solder bumps 36 in the form of balls are arranged over the surface (second surface, mounting surface) opposite to the main surface of the wiring board 32.

The flat surface of the semiconductor chip 31, which is square (in this embodiment, it is a square). The semiconductor chip 31 mainly includes a semiconductor substrate, plural transistors formed over the main surface of the semiconductor substrate, a primary wiring layer disposed over the main surface of the semiconductor substrate and a surface protective film which covers the primary wiring layer, though the invention is not limited thereto. The primary wiring layer is a multilayer wiring layer formed as a laminate of plural insulating layers and plural wiring layers. The semiconductor substrate is, for example, made of monocrystal silicon; the insulating layers of the primary wiring layer 3 are, for example, made of silicon oxide; and the wiring layers of the multilayer wiring layer are made of metal, such as aluminum (Al) or aluminum alloy or copper (Cu) or copper alloy. The surface protective film is a multilayer film consisting of, for example, organic insulating layers and inorganic insulating layers of silicon oxide, silicon nitride or the like.

The semiconductor chip 31 has a main surface (circuit formation surface, first surface) and a reverse surface (second surface) which are disposed opposite to each other. An integrated circuit is formed over the main surface of the semiconductor chip 31. The integrated circuit mainly includes transistors formed over the main surface of the semiconductor substrate and wiring in the primary wiring layer. For example, plural electrode pads 4 (bonding pads) are formed as connectors over the main surface of the semiconductor chip 31. The electrode pads 4 are arranged, for example, along the sides of the semiconductor chip 31.

The flat surface of the wiring board 32 is square (in this embodiment, it is a square). For example, the wiring board 32 includes: a core material; a first protective film 32c which covers the core material; and a second protective film 32d which covers the reverse surface opposite to the main surface of the core material. The core material has a wiring layer (conductive layer) over each of its main and reverse surfaces. The core material may be a high-elasticity resin board impregnated with glass fiber epoxy resin or polyimide resin. The first protective film 32c is intended to protect the wiring provided in the wiring layer over the main surface of the core material, while the second protective film 32d is intended to protect the wiring provided in the wiring layer formed over the reverse surface of the core material. The first and second protective films (32c, 32d) are, for example, insulating resin films.

There is a chip mounting area (device mounting area) over the main surface of the wiring board 32. The reverse surface of the semiconductor chip 31 is bonded to the chip mounting area through an adhesive agent 33. For example, plural electrode pads 32a are arranged as connectors over the main surface of the wiring board 32. In this second embodiment, the plural electrode pads 32a are arranged around the semiconductor chip 31 (chip mounting area). Plural electrode pads 32b are arranged as connectors over the reverse surface of the wiring board 32 and a solder bump 36 is fixed to each of the electrode pads 32b.

The electrode pads 4 of the semiconductor chip 31 are electrically connected with the electrode pads 32a of the wiring board 32, respectively. In the second embodiment, electrical connection between the electrode pads 4 of the semiconductor chip 31 and the electrode pads 32a of the wiring board 32 is established by bonding wires 34. One end of a bonding wire 34 is connected with an electrode pad 4 of the semiconductor chip 31 and the other end of the bonding wire 34 is connected with a corresponding electrode pad 32a of the wiring board 32.

The bonding wires 34 are, for example, gold (Au) wires. The method of connection of the bonding wires 34 is based on a nail head bonding technique which combines thermo compression and supersonic vibration.

The semiconductor chip 31, plural bonding wires 34 and so on are sealed with a resin sealer 35 formed selectively over the main surface of the wiring board 32. In order to reduce stress, the resin sealer 35 is made of a biphenyl thermosetting resin to which a phenyl curing agent, silicone rubber and filler (for example, silica) are added. The resin sealer 35 is made by the transfer molding process, which is suitable for mass production. In the transfer molding process, which uses a mold die with a pot, runner, resin injection gate, cavity, etc., thermosetting resin is injected from the pot through the runner and the resin injection gate into the cavity to form a resin sealer.

The resin sealer 35 and the wiring board 32 are equal in terms of flat surface size, and the side face of the resin sealer 35 is flush with the side face of the wiring board 32. A brief outline of the process of manufacturing the semiconductor device 30 in accordance with the second embodiment is as follows (details will be given later). A multi-device substrate with plural product formation areas (multi-wiring board) is employed, and a resin sealer (collective resin sealer), which collectively resin-seals plural semiconductor chips mounted in the plural product formation areas of the multi-device substrate, is formed. Then, the multi-device substrate and the collective resin sealer are divided into plural pieces.

Regarding the wiring board 32, plural electrode pads 32a are electrically connected with plural electrode pads 32b through through-hole wiring, respectively. The electrode pads 32b are integrated with corresponding through-hole wiring lands 32h, as shown in FIG. 22.

Next, a multi-device substrate (multi-wiring board) 40 which is used in the manufacture of the semiconductor device 30 according to the second embodiment will be explained with reference to FIGS. 23 and 24.

As shown in FIGS. 23 and 24, the flat surface of the multi-device substrate 40 is rectangular in this embodiment. A mold area 41 is provided over the main surface (chip mounting surface) of the multi-device substrate 40 and plural product formation areas (device formation areas) 43 are provided in the mold area 41. A chip mounting area 44 is provided in each of the product formation areas 43. In the manufacture of semiconductor devices, a semiconductor chip (31) is mounted in each chip mounting area 44 and a resin sealer (35) is made to collectively resin-seal the plural semiconductor chips (31) mounted in the chip mounting areas 44.

Each product formation area 43, which is marked off by partitioning areas 42, has basically the same structure and the same flat surface shape as the wiring board 32, as shown in FIG. 20. The wiring board 32 is prepared by segmenting the multi-device substrate 40 into plural product formation areas 43. In the second embodiment, the multi-device substrate 40 has eighteen product formation areas 43 disposed in a matrix pattern, with six rows in the X direction and three columns in the Y direction (6×3), though the invention is not limited thereto.

Next, the process of manufacturing the semiconductor device 30 according to the second embodiment will be described with reference to FIGS. 25 to 30. As shown in FIG. 25, the steps from wafer preparation (201) to probe inspection (203) are collectively referred to as a front-end process (200) and the steps from segmentation (211) to shipment (225) are collectively referred to a back-end process (210).

First, a semiconductor wafer, for example, of monocrystal silicon is prepared (wafer preparation step 201 in FIG. 25). Then, plural product formation areas (chip formation areas), each having a circuit and plural electrode pads 4, are formed in a matrix pattern over the main surface of the semiconductor wafer (circuit formation surface) (circuit creation step 202 in FIG. 25). The plural product formation areas are marked off by partitioning areas (scribe areas) 11 and are spaced apart from each other. The product formation areas are mainly composed of transistors, a primary wiring layer (multilayer wiring layer) 3 with electrode pads 4, a surface protective film 5 and bonding holes 5a over the main surface of the semiconductor wafer.

Next, the circuit function of each product formation area is tested electrically using a probe card (probe inspection step 203 in FIG. 25). The probe inspection is carried out by pressing the probe needle of the probe card against an electrode pad 4.

Next, the semiconductor wafer is divided into plural pieces (segmentation step 211 in FIG. 25). This is achieved, for example, by dicing the semiconductor wafer along the partitioning areas of the semiconductor wafer. This step is carried out in a clean room where there are not more than 1000 particles of foreign matter not larger than 0.5 μm in a cubic centimeter. With the abovementioned steps, the semiconductor device 31 as shown in FIG. 20 is produced.

Figure 26:
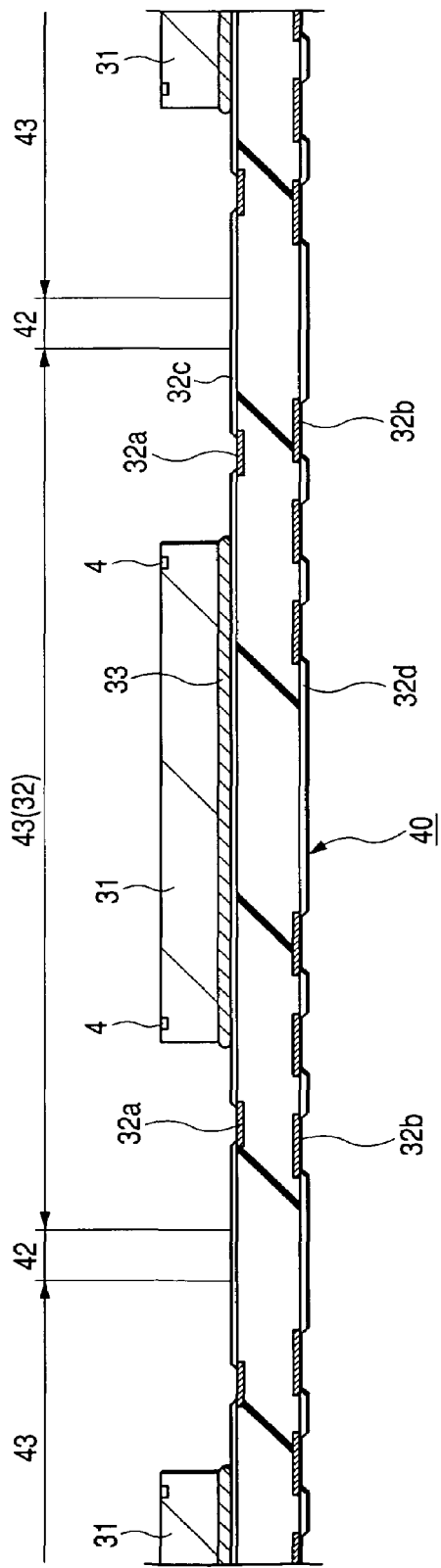
FIG. 26 is a sectional view concerning steps (continued from the steps of FIG. 25) in the manufacture of a semiconductor device.

Next, a multi-device substrate 40 as shown in FIG. 23 is prepared, and, as shown in FIG. 26, a semiconductor chip 31 is bonded to the chip mounting area 44 of each of the product formation areas 43 through an adhesive agent 33 (chip mounting step 212 in FIG. 25). This step is carried out while the reverse surface of the semiconductor chip 31 faces the main surface of the multi-device substrate 40.

Figure 27:
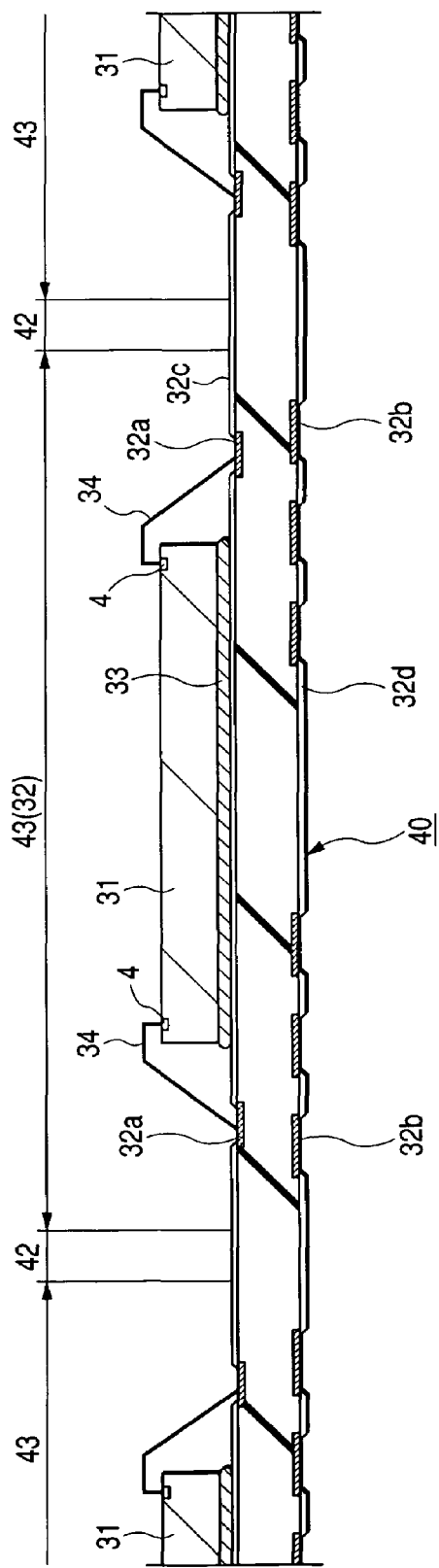
FIG. 27 is a sectional view concerning steps (continued from the steps of FIG. 26) in the manufacture of a semiconductor device.

Next, in each product formation area 43 of the main surface of the multi-device substrate 40, as shown in FIG. 27, plural electrode pads 32a in the product formation area 43 are electrically connected with plural electrode pads 4 of the semiconductor chip 31 mounted in the product formation area 43 by plural bonding wires 34, respectively (wire bonding step 213 in FIG. 25). The mounting of plural semiconductor chips 1 over the main surface of the multi-device substrate 40 is carried out in this way.

Here, the term "mounting" means that a semiconductor chip is bonded and fixed to a substrate and electrode pads of the substrate are electrically connected with electrode pads of the semiconductor chip. In the second embodiment, an adhesive agent 33 is used to bond the semiconductor chip 31 and bonding wires 34 are used for electrical connection between the electrode pads 32a in a product formation area 43 of the multi-device substrate 40 and the electrode pads 4 of the semiconductor chip 31.

Figure 28:
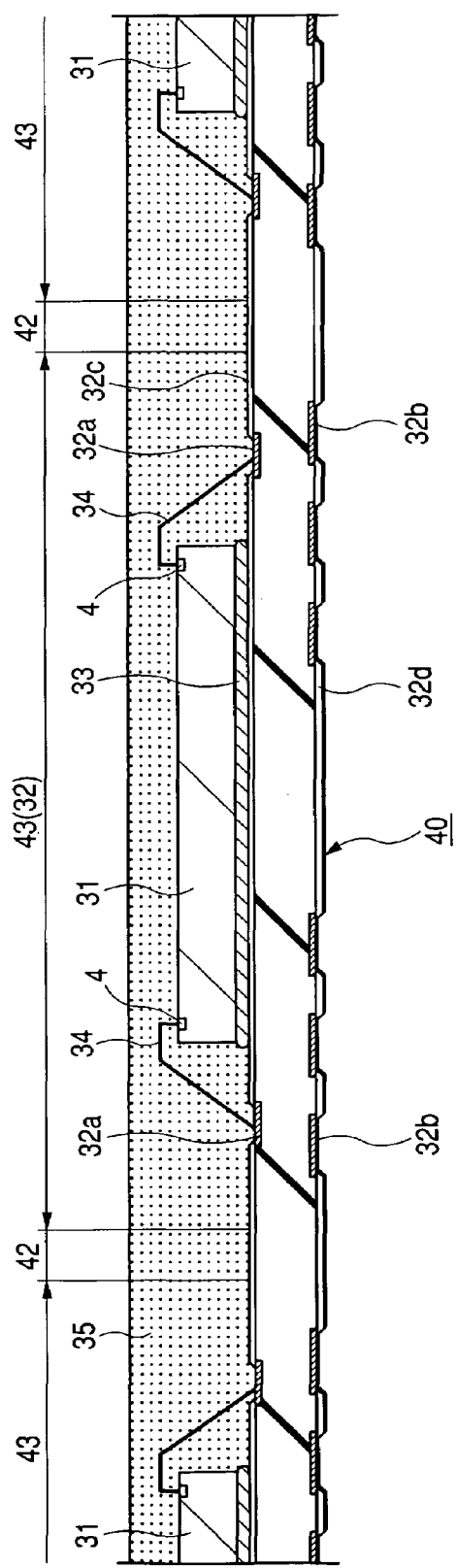
FIG. 28 is a sectional view concerning steps (continued from the steps of FIG. 27) in the manufacture of a semiconductor device.

Next, plural semiconductor chips 31 thus mounted over the main surface of the multi-device substrate 40 are collectively resin-sealed, and a resin sealer 35 is formed over the main surface of the multi-device substrate 40, as shown in FIG. 28 (resin sealing step 214 in FIG. 25). The resin sealer 35 lies over the mold area (41) of the main surface of the multi-device substrate 40 in such a way as to cover the plural product formation areas 43. The semiconductor chip 31, bonding wires 34 and so on in each product formation area 43 are resin-sealed by a resin sealer 35. The resin sealer 35 is provided by transfer molding as follows: a mold die with a cavity for covering the plural product formation areas 43 of the multi-device substrate 40 collectively is used and thermosetting resin is injected into the cavity.

Figure 29:
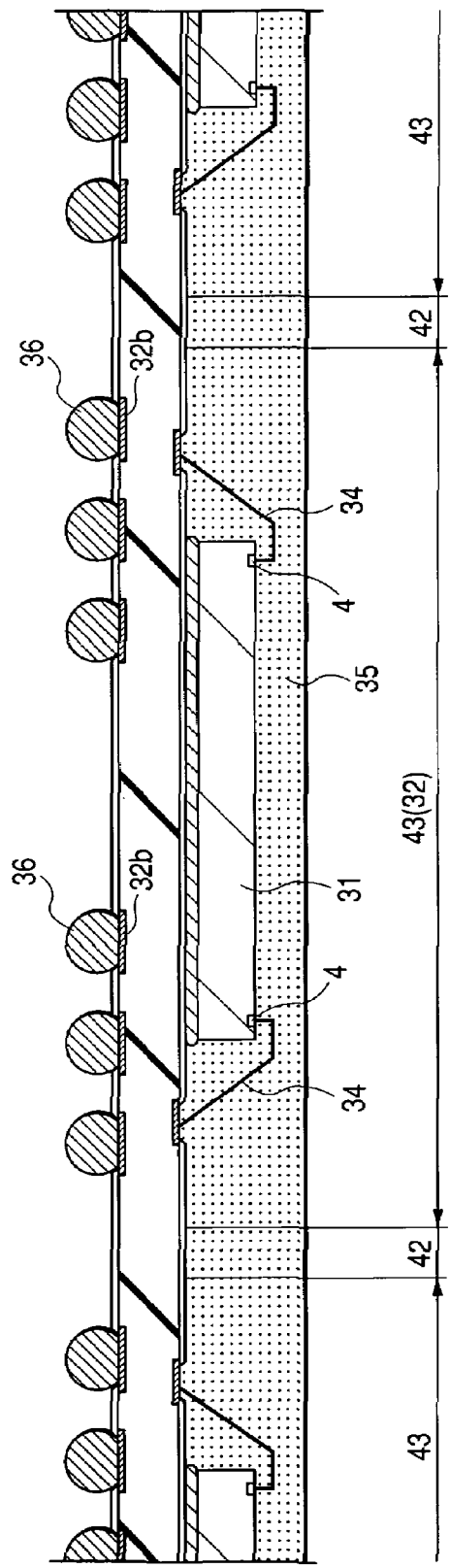
FIG. 29 is a sectional view concerning steps (continued from the steps of FIG. 28) in the manufacture of a semiconductor device.

Next, plural solder bumps 36 are made for each product formation area 43 over the reverse surface, opposite to the main surface, of the multi-device substrate 40, as shown in FIG. 29 (bump making step 215 in FIG. 25). For example, solder bumps 36 are made by coating the electrode pads 32b over the reverse surface of the multi-device substrate 40 with flux, then supplying solder balls to the electrode pads 32b by a ball supply method, and then melting the solder balls to fuse them with the electrode pads 32b.

Next, the flux used in the solder bump making step is cleaned away (flux cleaning step 216 in FIG. 25), and then an identification mark including a product name, company name, type, production lot number and other information is provided on the top surface of the resin sealer 35 for each product formation area 43 of the multi-device substrate 40 by ink jet marking, direct printing, laser marking or a similar technique (marking step 217 in FIG. 25).

Figure 30:
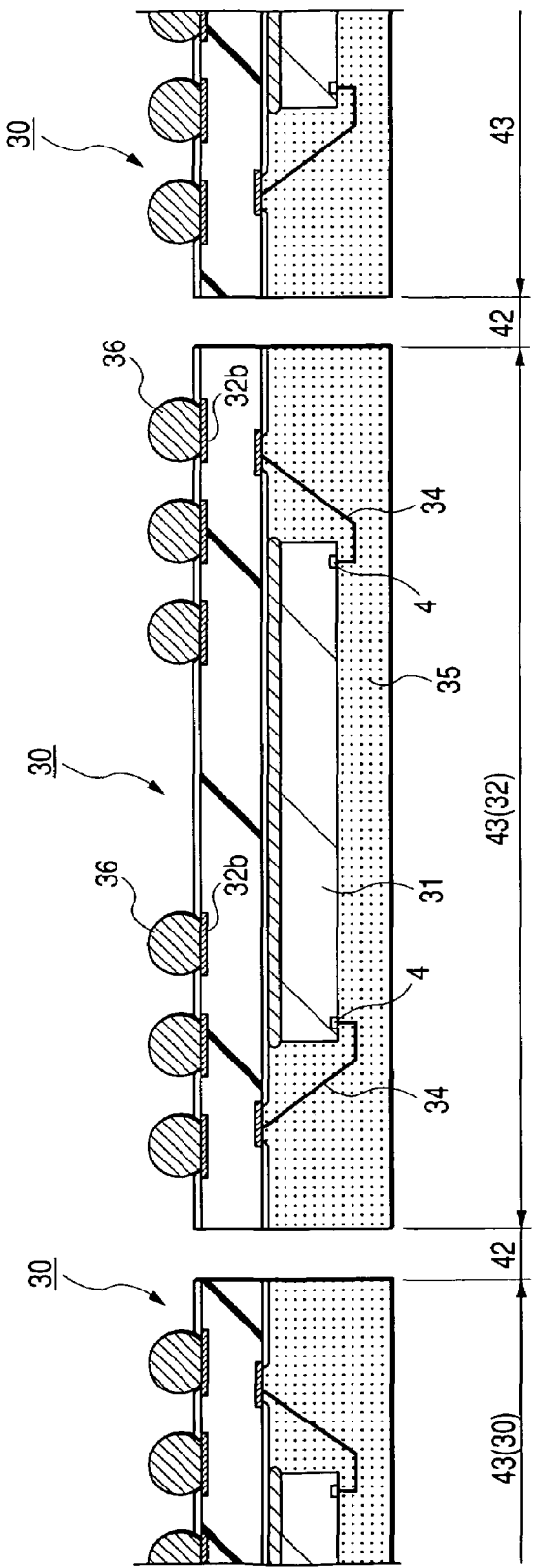
FIG. 30 is a sectional view concerning steps (continued from the steps of FIG. 29) in the manufacture of a semiconductor device.

As shown in FIG. 30, the multi-device substrate 40 and the resin sealer 35 are segmented into pieces (segmentation step 218 in FIG. 25). This segmentation is carried out, for example, by dicing the multi-device substrate 40 and the resin sealer 35 along the partitioning areas 42 of the multi-device substrate 42. With the abovementioned steps, the semiconductor device according to the second embodiment, as shown in FIG. 20, is almost finished.

Next, the separate semiconductor devices 30 produced as a result of segmentation are packed in a tray (tray packing step 219 in FIG. 25) and the packed tray is transported to the burn-in area where the burn-in step is carried out on each semiconductor device 30 (burn-in step 220 in FIG. 25). In the burn-in step, the semiconductor device 30 is attached to a socket and electrically connected with a burn-in board through this socket. Electrical connection between the socket and the semiconductor device 30 is effected by pressing a solder bump 36 of the semiconductor device 30 against the contact pin of the socket. Due to friction in this pressure contact, etc., solder bump residues adhere to the contact pin. In the burn-in step, plural sockets are repeatedly used, and how many times one socket is used in a day depends on the semiconductor device production volume and the number of sockets in use. One socket may be used several hundreds of times per day. Each time the socket is used, solder bump residues are accumulated on the contact pin.

Solder bump residues accumulated on the contact pin peel off the contact pin and, for some reason, adhere to the mounting surface (surface which face the substrate during mounting) of the semiconductor device 30 as foreign matter. Also, solder bump residues which are produced by friction in contact pressure, etc. adhere to the mounting surface of the semiconductor device 30 as foreign matter for some reason. For the chip level CSP type semiconductor device 30 according to the second embodiment, although dicing for segmentation of the semiconductor wafer into semiconductor chips 31 is carried out in a clean room, the steps after segmentation are carried out in a non-clean room. Hence, not only solder bump residues, but also other types of foreign matter may adhere to the mounting surface of the semiconductor device 30.

Next, an electrical characteristic evaluation test is conducted to check whether or not the semiconductor device 30 works normally (sorting step 221 in FIG. 25). In this characteristic evaluation test, the semiconductor device 30 is attached to the socket and electrically connected with a performance board (testing wiring board) through the socket. Therefore, foreign matter (residues of solder bumps 36) may adhere to the mounting surface of the semiconductor device 30 in the sorting process as well.

Next, foreign matter on the mounting surface of the semiconductor device 30 is removed by cleaning as follows. The automatic foreign matter cleaning system 20, as shown in FIG. 15, is employed for dry ice cleaning.

Next, a final visual inspection of the semiconductor device 30 is carried out (final visual inspection step 223). Then, the semiconductor device 30 is packed (step 224) and shipped as a product (step 225).

As stated above, the method of manufacture of a chip level CSP type semiconductor device 30 according to the second embodiment brings about the same effects as the one according to the first embodiment.

So far, various preferred embodiments of the present invention have been specifically described. However, obviously the present invention is not limited to the above-described embodiments, but may be embodied in other various forms without departing from the scope and spirit thereof.

For example, resin sealing for semiconductor devices may be carried out using either an individual transfer molding method or a collective transfer molding method. In the individual transfer molding method, a multi-device substrate having plural product formation areas is employed and semiconductor chips in the product formation areas are resin-sealed on an area-by-area basis. In the collective transfer molding method, a multi-device substrate having plural product formation areas is employed and semiconductor chips in the product formation areas are resin-sealed collectively or all at once. The collective transfer molding method has been explained in association with the semiconductor device according to the second embodiment. However, the individual transfer molding method may also be used in accordance with the present invention.

Although a semiconductor device has plural solder bumps over the reverse surface of the wiring board in the second embodiment, the present invention may be applied to an LGA (Land Grid Array) type semiconductor device which has no solder bumps over the reverse surface of the wiring board and uses electrode pads of the wiring board as external connection terminals.

Although a semiconductor device has plural solder bumps in the secondary wiring layer in the first embodiment, the present invention may be applied to an LGA type semiconductor device which has no solder bumps in the secondary wiring layer and uses electrode pads in the secondary wiring layer as external connection terminals.

Although a semiconductor device has a single semiconductor chip over the main surface of the wiring board in the second embodiment, the present invention may be applied to an MCP (Multi Chip Package) type semiconductor device which has plural semiconductor chips over the main surface of the wiring board.

What is claimed is:

1. A method of manufacturing a semiconductor device comprising the steps of:
    forming a plurality of product formation areas each having a circuit and a plurality of first electrode pads on a main surface of a semiconductor wafer;
    forming a protective film over the circuit;
    forming a plurality of second electrode pads using a rewiring process over said protective film, each of the plurality of second electrode pads being electrically connected to a respective first electrode pad via a rewiring layer, the second electrode pads having larger pitches than the first electrode pads in each of the product formation areas;
    forming a bump electrode over each of the second electrode pads;
    segmenting the semiconductor wafer to separate the plural product formation areas and making a plurality of semiconductor chips each having the circuit, the plural first electrode pads, the plural second electrode pads, the bump electrodes and the rewiring layers over a first surface thereof; and
    after the segmenting step, inspecting the plural product formation areas,
    wherein the inspecting step includes a sub-step, after the segmenting step, of cleaning foreign matter adhered to the first surface of the semiconductor chip, and
    wherein the cleaning step is performed by spraying dry ice particles to the first surface of each of the semiconductor chips.

2. The method of manufacturing a semiconductor device according to claim 1,
    wherein the particle size of the powder dry ice is in the range from 0.1 mm to 0.3 mm.

3. The method of manufacturing a semiconductor device according to claim 1,
    wherein the inspecting step includes sub-steps of attaching the semiconductor chip to a socket and carrying out burn-in, and
    wherein the cleaning sub-step is performed after the burn-in sub-step.

4. The method of manufacturing a semiconductor device according to claim 1, wherein the protective film contains an organic substance.

5. The method of manufacturing a semiconductor device according to claim 1, wherein an area of each second electrode pad is greater than that of each of the first electrode pads.

* * * * *